(12) United States Patent
Nishizawa et al.

(10) Patent No.: US 7,478,473 B2
(45) Date of Patent: Jan. 20, 2009

(54) METHOD OF MANUFACTURING AN IC CARD

(75) Inventors: Hirotaka Nishizawa, Fuchu (JP); Kenji Osawa, Hachioji (JP); Akira Higuchi, Kodaira (JP); Junichiro Osako, Kodaira (JP); Tamaki Wada, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 15 days.

(21) Appl. No.: 11/536,433

(22) Filed: Sep. 28, 2006

(65) Prior Publication Data

US 2007/0023885 A1 Feb. 1, 2007

Related U.S. Application Data

(62) Division of application No. 10/668,187, filed on Sep. 24, 2003, now Pat. No. 7,120,029.

(30) Foreign Application Priority Data

Sep. 30, 2002 (JP) ............................. 2002-285679

(51) Int. Cl.
*H05K 3/30* (2006.01)
(52) U.S. Cl. .............................. 29/834; 29/832; 29/840; 361/737; 439/946
(58) Field of Classification Search ........... 29/830–832, 29/834, 836, 841, 840, 854; 257/679, 693; 235/492; 361/737, 822; 438/127; 439/945, 439/946

See application file for complete search history.

(56) References Cited

U.S. PATENT DOCUMENTS

| | | | | |
|---|---|---|---|---|
| 4,797,542 A | | 1/1989 | Hara | 235/380 |
| 5,272,374 A | * | 12/1993 | Kodai et al. | 257/679 |
| 5,502,620 A | | 3/1996 | Funck et al. | 361/753 |
| 5,529,503 A | | 6/1996 | Kerklaan | 439/76.1 |
| 5,530,622 A | | 6/1996 | Takiar et al. | 361/737 |
| 5,544,007 A | | 8/1996 | Inoue | 361/684 |
| 5,822,190 A | * | 10/1998 | Iwasaki | 361/737 |
| 5,846,092 A | | 12/1998 | Feldman et al. | 439/76.1 |
| 6,295,206 B1 | | 9/2001 | Kondo et al. | 361/736 |
| 6,381,143 B1 | | 4/2002 | Nakamura | 361/737 |
| 6,444,501 B1 | * | 9/2002 | Bolken | 438/127 |

FOREIGN PATENT DOCUMENTS

JP 2001-15296 1/2002

* cited by examiner

*Primary Examiner*—Donghai D. Nguyen
(74) *Attorney, Agent, or Firm*—Miles & Stockbridge P.C.

(57) ABSTRACT

The productivity of an IC card is to be improved. In a memory card of the type in which a memory body having a wiring substrate and a semiconductor chip mounted on a main surface of the wiring substrate is held so as to be sandwiched in between a first case and a second case, a planar outline of the memory body is smaller than half of a planar outline of the memory card. The memory body is disposed so as to be positioned closer to a first end side as one short side of the memory card with respect to a midline between the first end side and a second end side as an opposite short side of the memory card positioned on the side opposite to the first end side. The other area than the memory body-disposed area in the first and the second case is used as another functional area.

4 Claims, 38 Drawing Sheets

2a: FIRST CASE
3: SWITCH
4: MEMORY BODY (IC BODY)
4a: WIRING SUBSTRATE
4t: EXTERNAL CONNECTING TERMINAL

C1: FIRST END SIDE
C2: SECOND END SIDE
CL: MIDLINE

8-BIT MODE PIN ARRAY

4-BIT MODE PIN ARRAY

1-BIT MODE PIN ARRAY

METHOD OF MANUFACTURING AN IC CARD

This application is a division of application Ser. No. 10/668,187 filed Sep. 24, 2003, now U.S. Pat. No. 7,120,029.

BACKGROUND OF THE INVENTION

The present invention relates to an IC (integrated circuit) card and a technique for manufacturing the same. For example, the present invention is concerned with a technique which is effectively applicable to a semiconductor memory card (hereinafter referred to simply as "memory card").

A memory card such as a multi-media card which is defined by a standard issued from Multi-Media Card Association and an SD memory card which is defined by a standard issued from SD Card Association, is a kind of memory which stores information in a semiconductor memory chip mounted in the interior of the memory card. The memory card is highly characteristic in that information can be accessed directly and electrically for a non-volatile memory in a semiconductor chip, that is, there is no control of a mechanical system, and that therefore the write/read time is shorter than that of other memories and it is possible to change storage media. Besides, since the memory card is small-sized and light-weight, it is used mainly as an auxiliary memory in a device for which portability is required, such as a portable personal computer, a portable telephone, or a digital camera. There is known a memory card of a structure wherein a mounting substrate with a semiconductor memory mounted thereon is sandwiched in between upper and lower housings (see, for example, Patent Literature 1).

[Patent Literature 1]

Japanese Published Unexamined Patent Application No. 2002-15296

SUMMARY OF THE INVENTION

However, in the above IC card manufacturing technique, it is an important subject in what manner a highly reliable IC card is to be obtained and in what manner an IC card is to be assembled efficiently. Particularly, in the case of a memory card of the aforesaid structure wherein a mounting substrate with a semiconductor memory mounted thereon is sandwiched in between upper and lower housings, the number of components is large and the components are conveyed in a discrete state to an assembling process, so it is necessary to align components prior to the assembling process. Such an alignment work may be a troublesome work which requires much time and labor.

It is an object of the present invention to provide a technique capable of improving the reliability of an IC card.

It is another object of the present invention to provide a technique capable of improving the productivity of an IC card.

The above and other objects and novel features of the present invention will become apparent from the following description and the accompanying drawings.

Typical modes of the present invention as disclosed herein will be outlined below.

In an IC card of the type wherein an IC body having a wiring substrate and a semiconductor chip connected electrically to the wiring substrate is sandwiched by a case, the IC body, which has a planar outline smaller than half of the case, is disposed in an area closer to a first end side of the case than a midportion between the first end side and a second end side of the case opposite to the first end side.

Further, in an IC card wherein an IC body having a wiring substrate and a semiconductor chip connected electrically to the wiring substrate is sandwiched by a case, the IC body having a planar outline smaller than half of the case is disposed in a first area closer to a first end side of the case than a midportion between the first end side and a second end side of the case opposite to the first end side, and a second area which contributes to the assembling of the IC card is provided in the other area than the first area of the case.

DETAILED DESCRIPTION OF THE PREFERRED EMBODIMENTS

Figure 1:
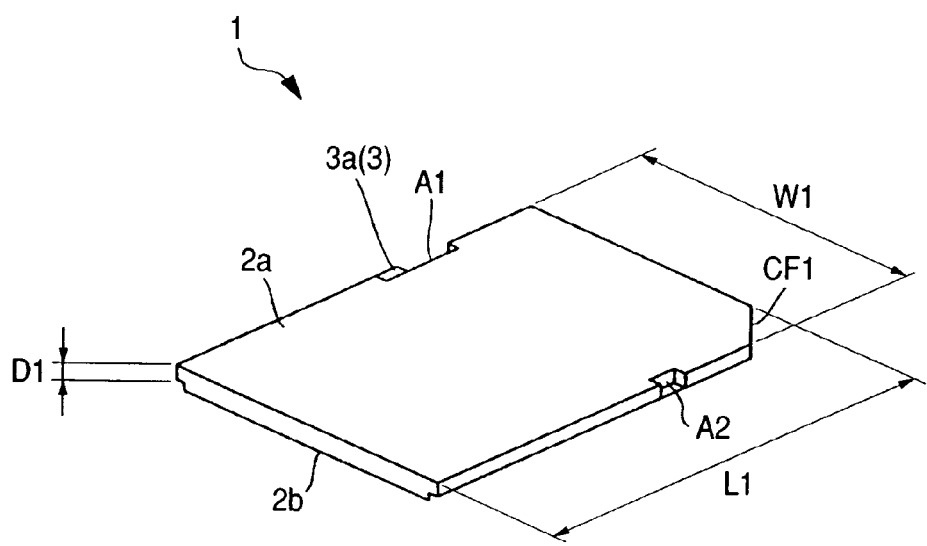
FIG. 1 is an entire perspective view of a main surface side of an IC card according to a first embodiment of the present invention.

Where required for convenience' sake, the following embodiments will be described in a divided manner into plural sections or embodiments, but unless otherwise mentioned, they are not unrelated to each other, but are in a relation such that one is a modification, a description of details, or a supplementary explanation, of part or the whole of the other. In the following embodiments, when reference is made to the number of elements (including the number, numerical value, quantity, and range), no limitation is made to the number referred to, but numerals above and below the number referred to will do as well unless otherwise mentioned and except the case where it is basically evident that limitation is made to the number referred to. Further, it goes without saying that in the following embodiments their constituent elements (including constituent steps) are not always essential unless otherwise mentioned and except the case where they are considered essential basically obviously. Likewise, it is to be understood that when reference is made to the shapes and positional relation of components in the following embodiments, those substantially closely similar to or resembling such shapes, etc. are also included unless otherwise mentioned and except the case where a negative answer results basically obviously. This is also true of the foregoing numerical value and range. Moreover, in all of the drawings for illustrating the following embodiments, portions having the same functions are identified by like reference numerals and repeated explanations thereof will be omitted. In the drawings related to the following embodiments, even a plan view may be hatched to make it easier to see. Embodiments of the present invention will be described in detail hereinunder with reference to the accompanying drawings.

First Embodiment

Figure 2A:
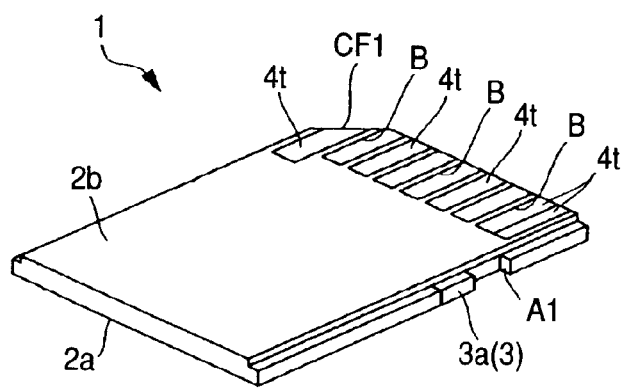
FIG. 2(a) is an entire perspective view of a back side of the IC card of the first embodiment.
Figure 2B:
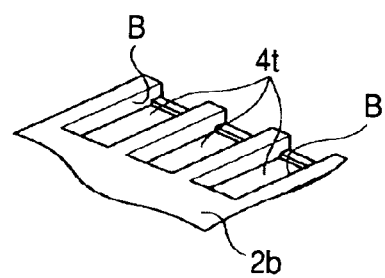
FIG. 2(b) is an enlarged perspective view of a principal portion of FIG. 2(a)

FIG. 1 is an entire perspective view of a memory card (IC card) 1 according to a first embodiment of the present invention as seen from a main surface side of the memory card, FIG. 2(a) is an entire perspective view of the memory card 1 as seen from a back side thereof, and FIG. 2(b) is an enlarged perspective view of a principal portion of FIG. 2(a).

The memory card 1 of this embodiment is employable mainly as an auxiliary memory in, for example, information processors such as portable computers, image processors such as digital cameras, communication devices such as portable telephones, or various portable electronic devices. For example, the memory card 1 is constituted by a small thin plate of a rectangular shape in plan having, as external dimensions, a long side L1 of 32 mm, a width W1 of 24 mm, and a thickness D1 of 2.1 mm. Thus, the memory card 1 is a card having the same external specification and function as those of a so-called SD card. An external shape of the memory card 1 is defined by a first case 2a and a second case 2b. For attaining the reduction of weight, easy machinability and flexibility, the first and second cases 2a, 2b are formed of a resin having insulating property such as ABS resin or PPE (polyphenylene ether). One corner on a front side of each of the first and second cases 2a, 2b is chamfered and a chamfered portion CF1 for index is formed in the thus-chamfered corners of both cases. The chamfered portion CF1 is standardized and functions to make a loading direction easier to recognize at the time of loading the memory card 1 into a desired electronic device and also functions to prevent the memory card from being inserted reverse into a connector.

In portions of both long sides of the first and second cases 2a, 2b there are formed grooves A1 and A2 so as to be depressed along short sides of the memory card 1. A surface portion 3a of a switch 3 is exposed from one long-side groove A1. The switch 3 makes switching between data write possible and impossible conditions. The exposed surface portion 3a of the switch 3 is movable in the longitudinal direction of the memory card 1. The switch illustrated in the drawing is of the type in which an electronic device reads the position of the surface portion 3a optically or mechanically and whether data write is possible or not is judged automatically in accordance with the read position of the exposed surface portion 3a. On the other hand, the other long-side groove 2A formed in the first and second cases 2a, 2b is for constituting a latch mechanism which prevents the memory card 1 from coming off accidentally from a desired electronic device.

Plural apertures B, which are rectangular in plan for example, are formed in a row at predetermined certain intervals along front short side of the memory card 1 and in the vicinity of the front side of the second case 2b located on the back of the memory card 1. External connecting terminals 4t are exposed from the apertures B. In the illustrated example, nine external connecting terminals 4t are exposed, of which two external connecting terminals 4t are exposed from the aperture B located in the rightmost end position.

Figure 3:
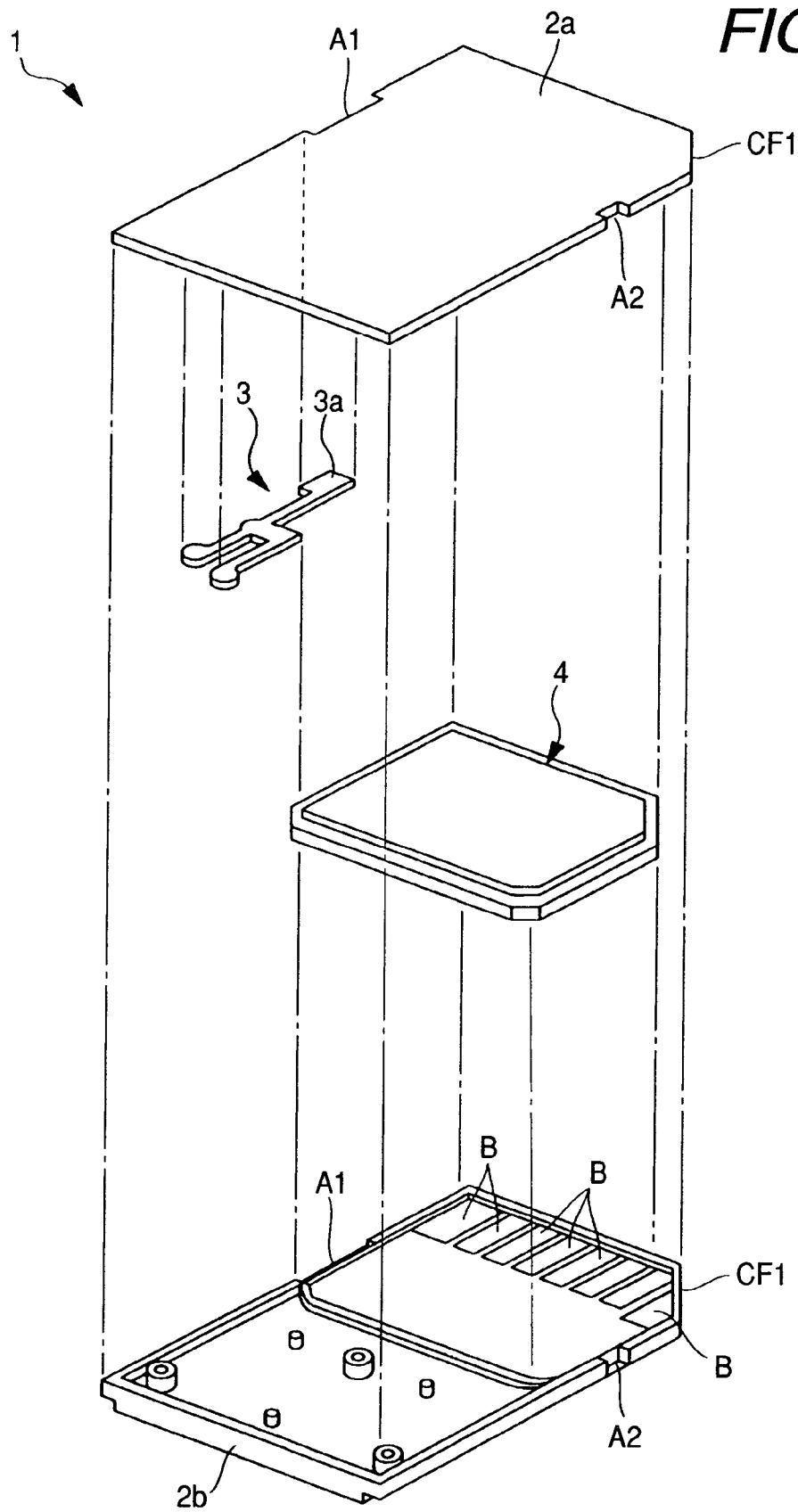
FIG. 3 is an exploded perspective view of the IC card shown in FIGS. 1 and 2(a) and 2(b)
Figure 4:
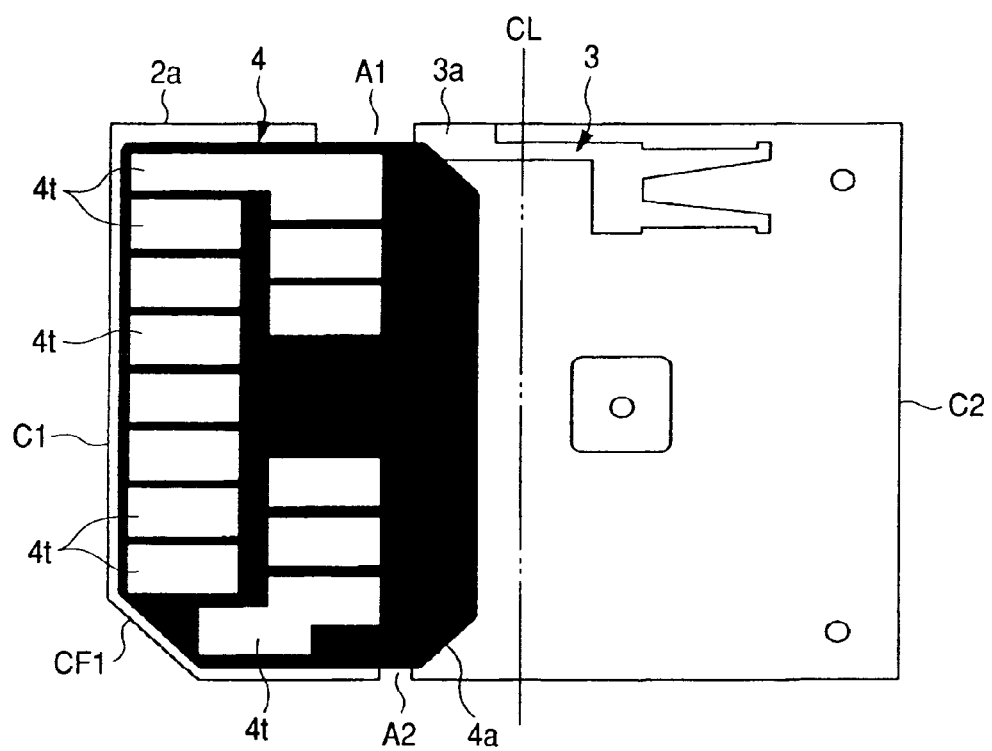
FIG. 4 is a plan view of an inner surface of a first case in a state in which a switch and an IC body of the IC card shown in FIGS. 1 to 3 are disposed.
Figure 5:
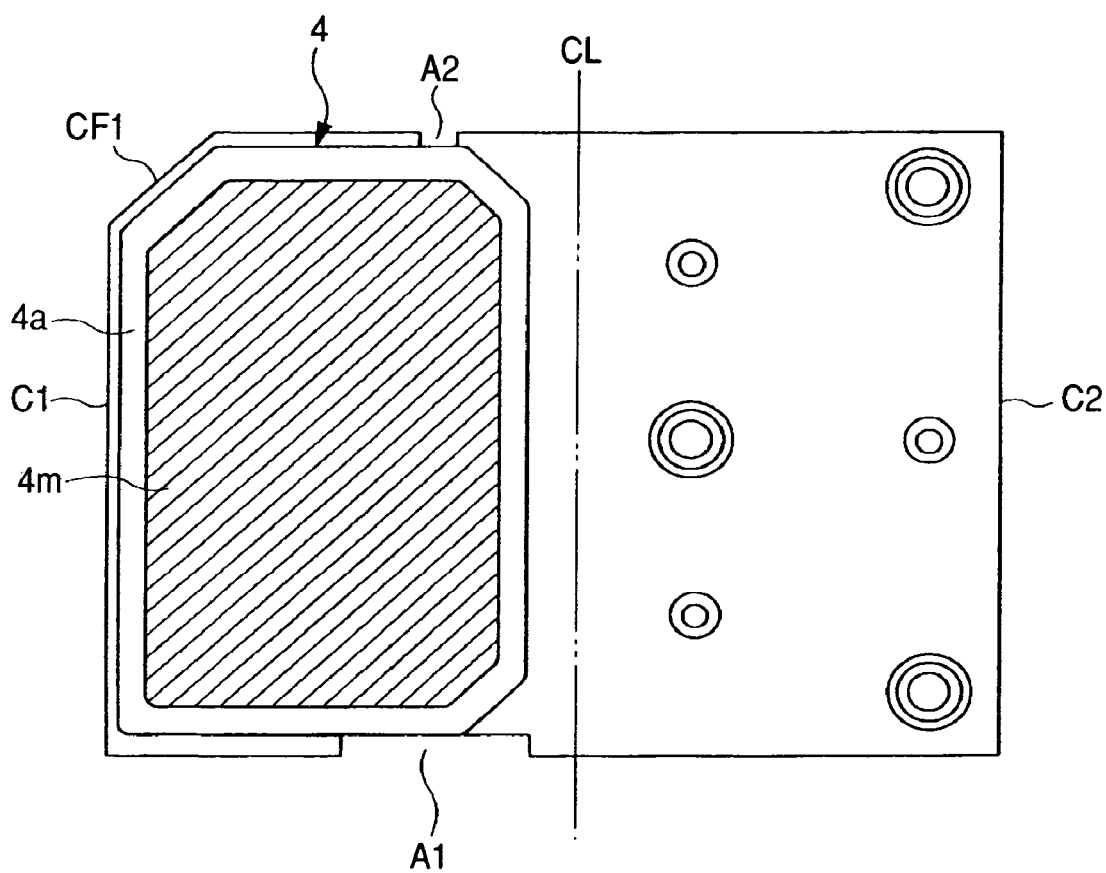
FIG. 5 is a plan view of an inner surface of a second case in a state in which the switch and the IC body of the IC card shown in FIGS. 1 to 3 are disposed.

FIG. 3 is an exploded perspective view of the memory card 1 shown in FIGS. 1 and 2. The memory card 1 of this embodiment comprises the first case 2a, the second case 2b, the switch 3, and a memory body (IC body) 4, and has a construction wherein the switch 3 and the memory body 4 are sandwiched in between the first and second cases 2a, 2b. FIGS. 4 and 5 are plan views of inner surfaces of the first and second cases 2a, 2b with the switch 3 and the memory body 4 installed therein. As will be described later, the memory body 4 comprises a wiring substrate 4a, the plural external connecting terminals 4t which are arranged on a back side of the wiring substrate 4a, semiconductor chips mounted on a main surface of the wiring substrate 4a and a sealing member 4m which seals the semiconductor chips. In FIG. 4, the back side (the portion exclusive of the external connecting terminals 4t) of the wiring substrate 4a of the memory body 4 is painted out in black color in order to make the drawing easier to see. In FIG. 5, for the same purpose as above, the sealing member 4m of the memory body 4 is hatched. In this embodiment, for convenience' sake, out of both longitudinal end sides of the first and second cases 2a, 2b, the sides where the external connecting terminals 4t are arranged are designated a first end side C1, where the sides positioned opposite to the first end side are designated a second end side C2. In each of FIGS. 4 and 5, a midline CL indicated by a dash-double dot line represents a middle position in the longitudinal direction of each of the cases 2a and 2b (i.e., in the longitudinal direction of the memory card 1). The memory body 4 is disposed in an area between the first end side C1 of the first and second cases 2a, 2b and the midline CL in such a manner that the long sides of its wiring substrate 4a run along the first end side C1. In the memory body 4 used in this embodiment, a planar outline of the wiring substrate 4a is smaller than half of a planar outline of each of the first and second cases 2a, 2b, that is, a transverse size of the wiring substrate 4a of the memory body 4 is smaller than half of the longitudinal size of each of the first and second cases 2a, 2b. The midline CL portion of the memory card 1 is a portion on which a stress is most likely concentrated due to, for example, a bending stress induced at the time of using the memory card 1. It is effective for preventing deterioration and damage of the memory card 1 that the memory body 4 (the wiring substrate 4a and the semiconductor chips) which is likely to be deteriorated or damaged by a bending stress is not disposed in the midline CL portion of the memory card 1. According to the array of the memory body 4 of the memory card 1 in this embodiment it is possible to suppress or prevent deterioration and damage of the memory body 4 (the wiring substrate 4a and the semiconductor chips) caused by a bending stress and hence possible to improve the reliability and life of the memory card 1. The structure of the memory card 1 in this embodiment is advantageous also in an electrostatic breakdown test. In a certain electrostatic breakdown test, static electricity is applied from a rear side of the memory card 1 in a loaded state of the memory card into a tester. However, in the structure wherein a planar size of each of the first and second cases 2a, 2b and that of the wiring substrate 4a of the memory body 4 are almost equal to each other, the wiring substrate 4a of the memory body 4 is present near the rear side of the memory card 1 and the distance of an electric path from the rear side of the memory card 1 to the semiconductor chips in the memory body 4 is short, so that the semiconductor chips are apt to be broken down electrostatically in the electrostatic breakdown test. In contrast therewith, in the memory card 1 of this embodiment, a long insulating area is present between the back side of the memory card 1 and the wiring substrate 4a of the memory body 4 and the distance of the electric path from the rear side of the memory card 1 to the semiconductor chips in the memory body 4 is long. According to this structure, the semiconductor chips are difficult to be broken down in the electrostatic breakdown test. Thus, according to the array of the memory body 4 of the memory card 1 of this embodiment, it is possible to improve the yield and reliability of the memory card 1. Further, the weight of the memory card 1 depends much on the weight of the memory body 4, i.e., the total weight of both wiring substrate 4a and sealing member 4m. On this regard, in the memory card 1 of this embodiment, since the planar outline of the wiring substrate 4a of the memory body 4 is smaller than half of the planar outline of each of the first and second cases 2a, 2b, the area of the wiring substrate 4a of the memory body 4 and the volume of the sealing member 4m can be made smaller than the area of the wiring substrate and the volume of the sealing member, the wiring substrate having a structure such that the planar outline of the wiring substrate 4a of the memory 4 is made approximately equal to that of each of the first and second cases 2a, 2b, whereby the weight of the memory card 1 can be made lighter. Particularly, in the memory card 1 of this embodiment, since corners of the wiring substrate 4a of the memory body 4 are chamfered, it is possible to attain a further reduction of the card weight. Thus, according to the structure of the memory card 1 of this embodiment, it is possible to further improve the portability of the memory card 1. Besides, in the memory card 1 of this embodiment, the planar outline of the wiring substrate 4a of the memory body 4 is smaller than half of the planar outline of each of the first and second cases 2a, 2b, so in the both cases 2a and 2b it is possible to ensure a sufficient area (second area) other than the area (first area) for accommodating the memory body 4. That area (second area) can be used as various functional areas which will be described later, whereby there can be attained various effects to be described later. The longitudinal planar size of the wiring substrate 4a of the memory body 4 is almost equal (a little smaller) to the transverse planar size of each of the first and second cases 2a, 2b.

The following description is now provided about the components of the memory card 1.

Figure 6:
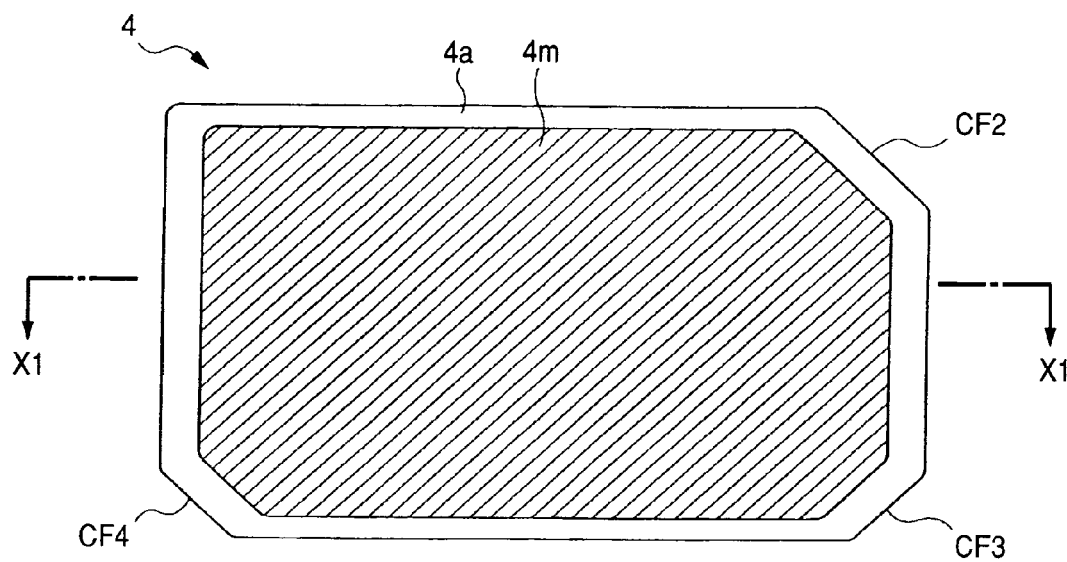
FIG. 6 is a plan view of a main surface side of the IC body of the IC card shown in FIGS. 1 to 3.
Figure 7:
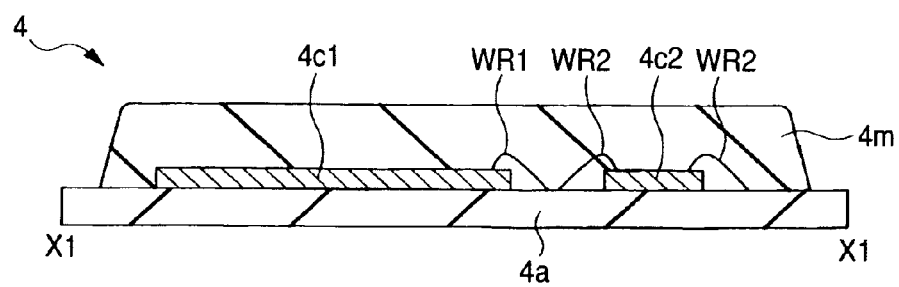
FIG. 7 is a sectional view taken on line X1-X1 in FIG. 6.
Figure 8:
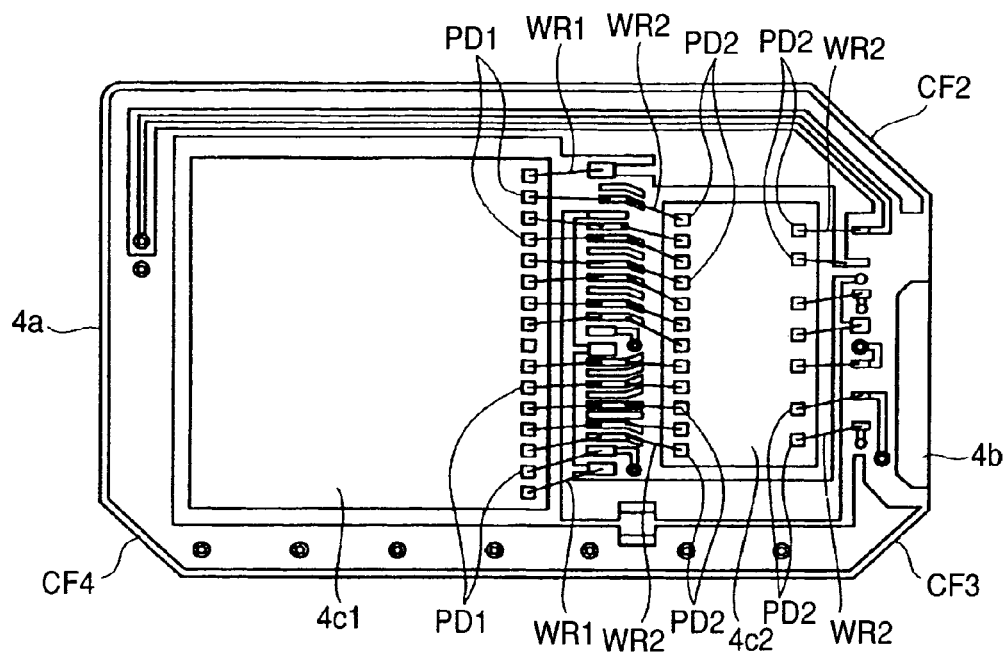
FIG. 8 is a plan view showing semiconductor chips in the IC body of the IC card shown in FIGS. 1 to 3.
Figure 9:
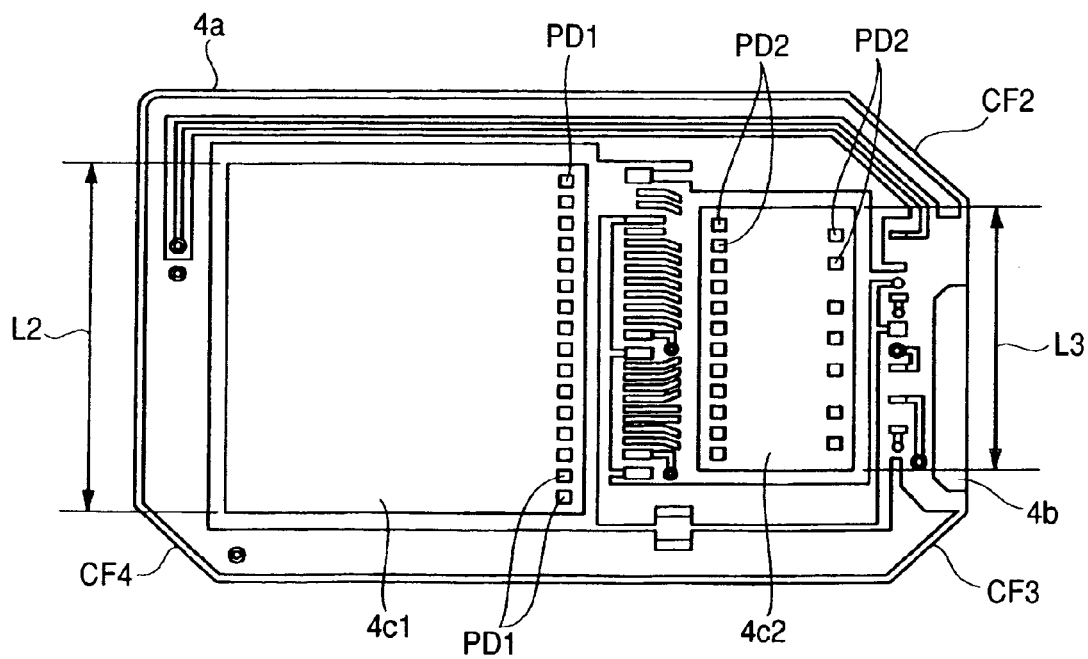
FIG. 9 is a plan view showing semiconductor chips in the IC body of the IC card shown in FIGS. 1 to 3.
Figure 10:
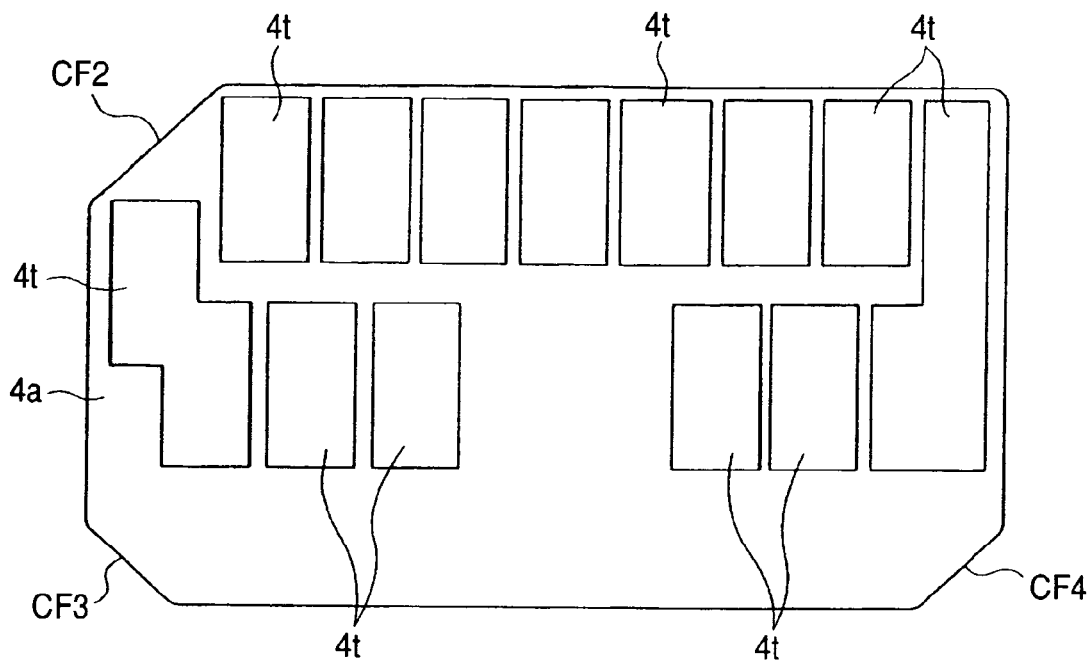
FIG. 10 is a plan view of a back side of the IC body of the IC card shown in FIGS. 1 to 3.
Figure 11:
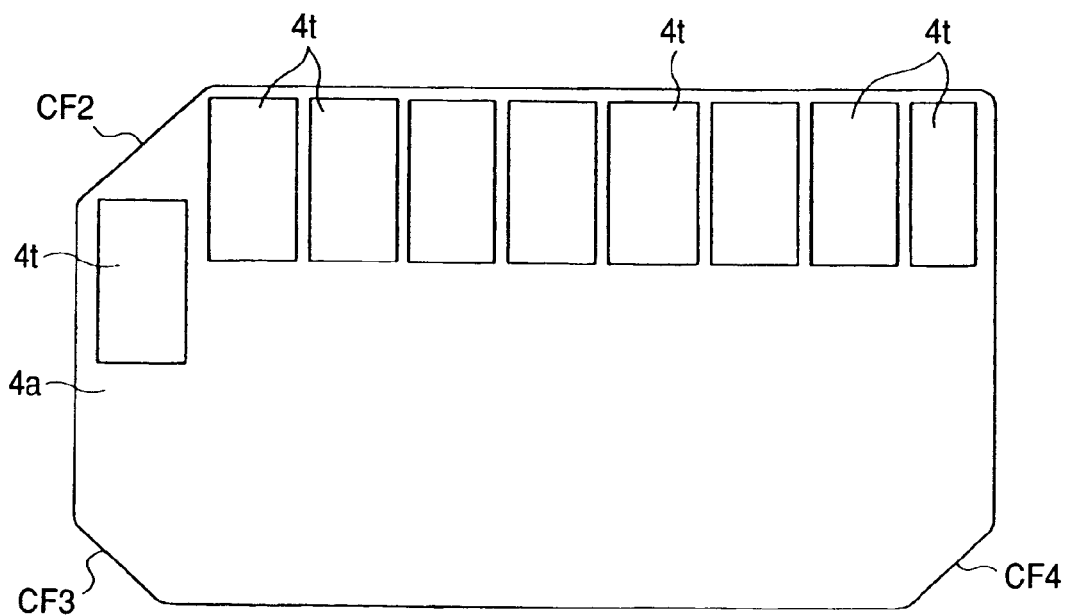
FIG. 11 is a plan view of the back side of the IC body of the IC card shown in FIGS. 1 to 3.

FIG. 6 is a plan view of a main surface of the memory body 4 of the memory card 1 shown in FIGS. 1 to 4, FIG. 7 is a sectional view taken on line X1-X1 in FIG. 6, FIGS. 8 and 9 are plan views showing semiconductor chips (simply "chips" hereinafter) 4c1 and 4c2 in the memory body 4, and FIGS. 10 and 11 are plan views of a back side of the memory body 4. For example, the wiring substrate 4a of the memory body has a wiring structure such that one metal wiring layer (wiring) or two or more metal wiring layers (multi-layer wiring) are formed in an insulator such as a glass fabric-based epoxy resin. The wiring substrate 4a has a rectangular planar outline for example, in which three corners are chamfered to form chamfered portions CF2, CF3, and CF4. The chamfered portion CF2, which is relatively large, is formed so as to extend along the chamfered portion CFI for index of the memory card 1. The two chamfered portions CF3 and CF4, which are smaller than the chamfered portion CF2, are of the same size and shape and are symmetric right and left with respect to each other. With such chamfered corners of the wiring substrate 4a, the weight of the wiring substrate can be reduced. Besides, it is possible to improve the strength of the first and second cases 2a, 2b against bending. On the main surface (chip mounting surface) of the wiring substrate 4a are mounted two chips 4c1 and 4c2 of different planar sizes with their main surfaces (device-forming surfaces) facing up and with their back sides bonded to the wiring substrate 4a through an adhesive or the like. The two chips 4c1 and 4c2 are arranged side by side in the longitudinal direction of the wiring substrate 4a (i.e., in the arranged direction of the plural external connecting terminals 4t (see FIGS. 10 and 11). On the chip 4c1 of a relatively large planar size is formed a flash memory (EEPROM: Electrically Erasable Programmable Read Only Memory) having a memory capacity of, for example, 16M bytes (128M bits), 32M bytes (256M bits), or 64M bytes (512M bits). The chip 4c1 is located at a position remote from the index-side chamfered portion CF2. On the other hand, on the chip 4c2 of a relatively small planar size is formed a controller for controlling the operation of the flash memory circuit on the chip 4c1. The chip 4c2 is located close to the index-side chamfered portion CF2. With such an array of the chips 4c1 and 4c2, it is possible to implement the memory card 1 of a large capacity. The memory chip 4c1 is closer to a square shape than the controller chip 4c2. The length L2 (see FIG. 9) of one longitudinal side of the memory chip 4c1 is set larger than the length L3 of one longitudinal side of the controller chip 4c2. Plural bonding pads (simply "pads" hereinafter) PD1 are arranged near and along one side of the main surface of the memory chip 4c1. That is, in the memory chip 4c1, there is adopted a one-side pad method wherein, in a peripheral portion of the main surface of the chip 4c1, plural pads PD1 are formed in a row along one side of the chip 4c1. The memory chip 4c1 is mounted in such a manner that one side thereof where the plural pads PD1 are arranged is positioned on a longitudinally central side of the wiring substrate 4a, i.e., on the controller chip 4c2 side. Of course, a desired memory capacity may be obtained as a whole by arranging plural memory chips 4c1 on the main surface of the wiring substrate 4a. Or, a desired memory capacity may be obtained as a whole by stacking chips. In case of thus stacking chips, a large capacity can be ensured by a small occupied area of the chips. The pads PD1 are electrically connected to wiring on the main surface of the wiring substrate 4a through bonding wires WR1. The bonding wires WR1 are formed by fine metal wires such as fine gold (Au) wires for example. On the other hand, on the main surface of the controller chip 4c2, plural pads PD2 are arranged in two rows respectively along two long sides opposed to each other. The controller chip 4c2 is mounted on the main surface of the wiring substrate 4a so that its long sides are substantially parallel to one side of the memory chip 4c1 where the plural pads PD1 are arranged. The pads PD2 are electrically connected to wiring on the main surface of the wiring substrate 4a through bonding wires WR2 which are the same as the bonding wires W1. The chips 4c1, 4c2, the bonding wires WR1, WR2, and the main surface of the wiring substrate 4a are mostly coated with the sealing member 4m formed of an epoxy resin for example. On a longitudinally front end side (the side where the chamfered portions CF2 and CF3 are formed) of the main surface of the wiring substrate 4a there is formed a metal layer 4b plated with gold for example. The metal layer 4b is a portion where a gate of a mold is disposed at the time of sealing the chips 4c1 and 4c2. More specifically, in forming the sealing member (see FIGS. 6 and 7), a sealing resin flows from the metal layer 4b side toward the arranged area of the memory chip 4c1 through the arranged area of the controller chip 4c2. The wiring on the main surface of the wiring substrate 4a is electrically connected via through holes to the external connecting terminals 4t formed on the back side of the wiring substrate 4a. FIG. 10 shows a case where thirteen external connecting terminals 4t are arranged, while FIG. 11 shows a case where nine external connecting terminals 4t are arranged. The external connecting terminals 4t are arranged regularly side by side in the longitudinal direction of the wiring substrate 4a and in the vicinity of one long side of the wiring substrate. In FIG. 10, plural external connecting terminals 4t are arranged in two rows, while in FIG. 11, plural external connecting terminals 4t are arranged in one row. Surfaces of the external connecting terminals 4t are plated with gold for example.

Figure 12:
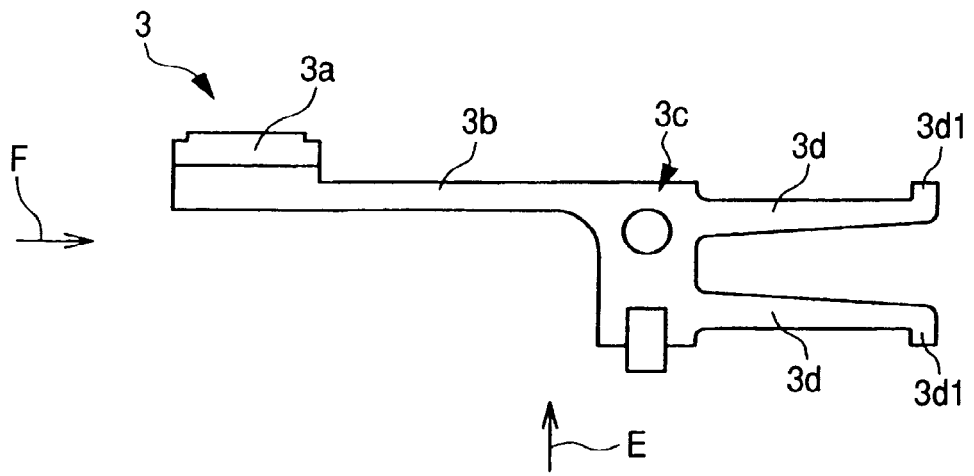
FIG. 12 is a plan view of the switch of the IC card shown in FIGS. 1 to 3.
Figure 13:
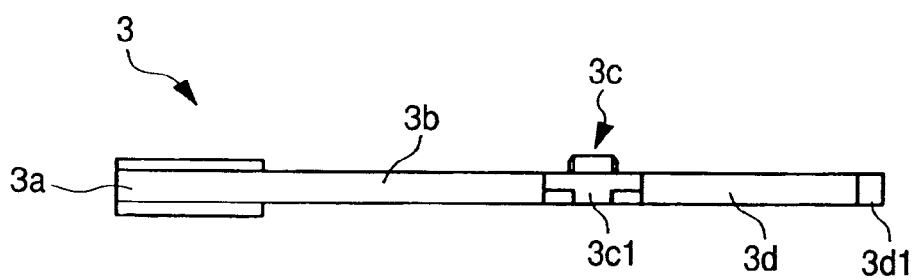
FIG. 13 is a side view of the switch as seen in the direction of arrow E in FIG. 12.
Figure 14:
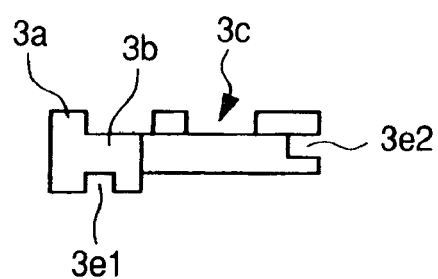
FIG. 14 is a side view of the switch as seen in the direction of arrow F in FIG. 12.

FIG. 12 is a plan view of the switch 3, FIG. 13 is a side view of the switch 3 as seen in the direction of arrow E in FIG. 12, and FIG. 14 is a side view of the switch 3 as seen in the direction of arrow F in FIG. 12. For example, the switch 3 is formed of the same material as that of first and second cases 2a, 2b and is integrally provided with the exposed surface portion 3a, a support portion 3b, a body portion 3c, and plate spring portions 3d. In the memory card 1 of this embodiment, as described above, since a planar outline of the memory body 4 is smaller than that of each of the first and second cases 2a, 2b, a sufficient area for mounting the switch 3 can be ensured in the first case 2a as will be described later. It is therefore possible to let the switch 3 have such a functional portion as creates various switch functions which will be described later. The exposed surface portion 3a of the switch 3 is formed integrally on one end side of the support portion 3b which is an elongated portion. On a back side of the switch 3, a fine recess portion 3e1 is formed in a boundary between the exposed surface portion 3a and the support portion 3b. A projecting portion formed on the inner surface side of the first case is fitted in the recess portion 3e1 as will be described later. The body portion 3c is connected to the opposite end side of the support portion 3b. A fine recess portion 3e2 is formed on one side face of the body portion 3c, and a projecting portion formed on the inner surface side of the first case 2a, which projecting portion is different from that referred to above, is fitted in the recess portion 3e2 as will be described later. Two plate spring portions 3d which extend in the longitudinal direction of the switch 3 are connected to the body portion 3c. At front ends of the plate spring portions 3d are formed projecting portions 3d1 respectively which are bent and somewhat extend in a direction perpendicular to the longitudinal direction of each plate spring portion 3d.

Figure 15:
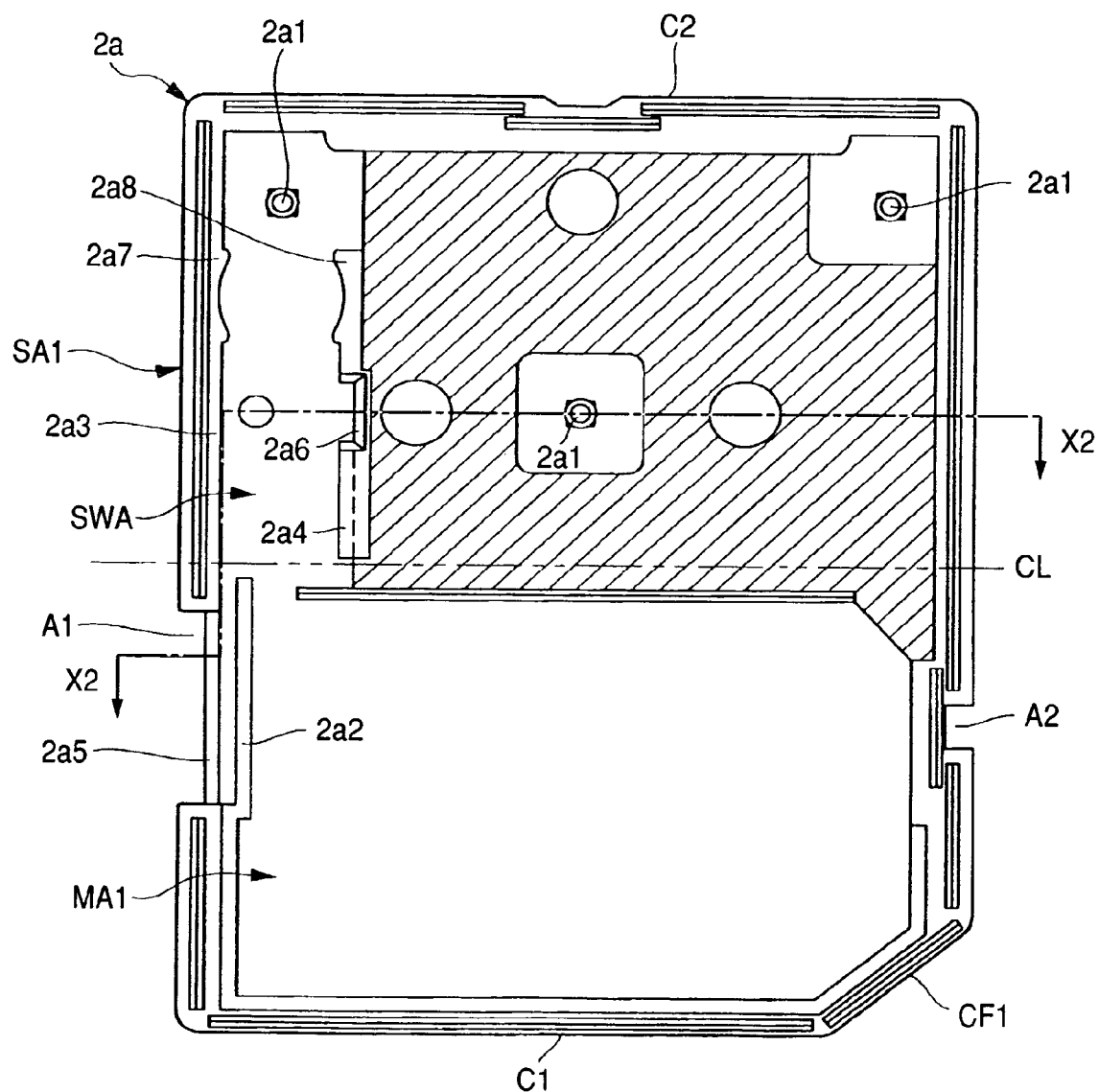
FIG. 15 is an entire plan view of the inner surface side of the first case of the IC card shown in FIGS. 1 to 3.
Figure 16:
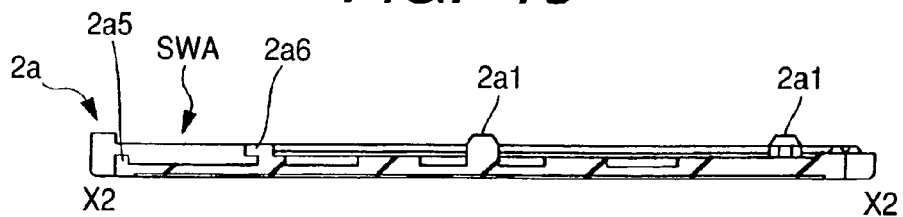
FIG. 16 is a sectional view taken on line X2-X2 in FIG. 15.
Figure 17:
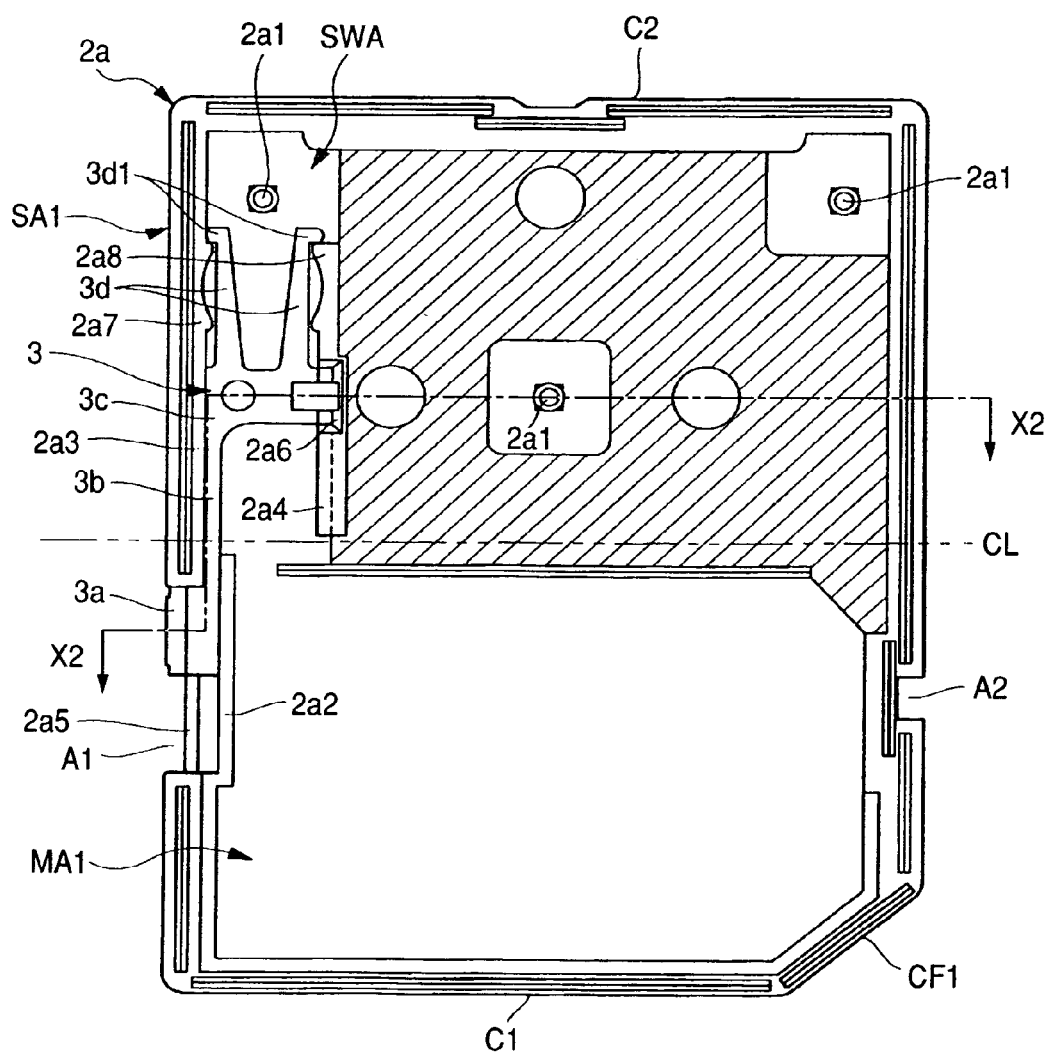
FIG. 17 is an entire plan view of the inner surface side of the first case, showing a state in which the switch has been mounted to the first case shown in FIG. 16.
Figure 18:
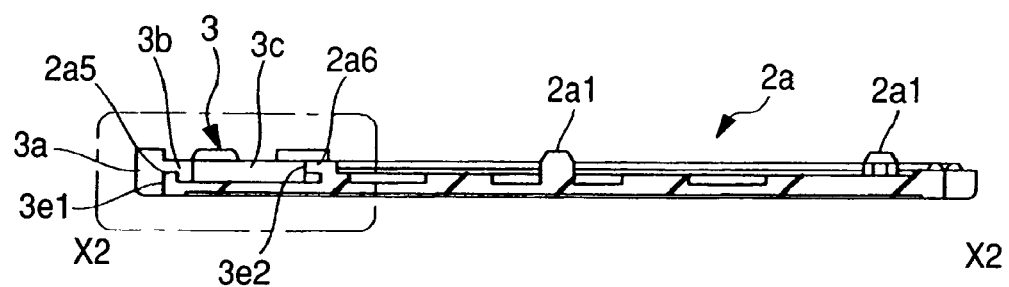
FIG. 18 is a sectional view taken on line X2-X2 in FIG. 17.
Figure 19:
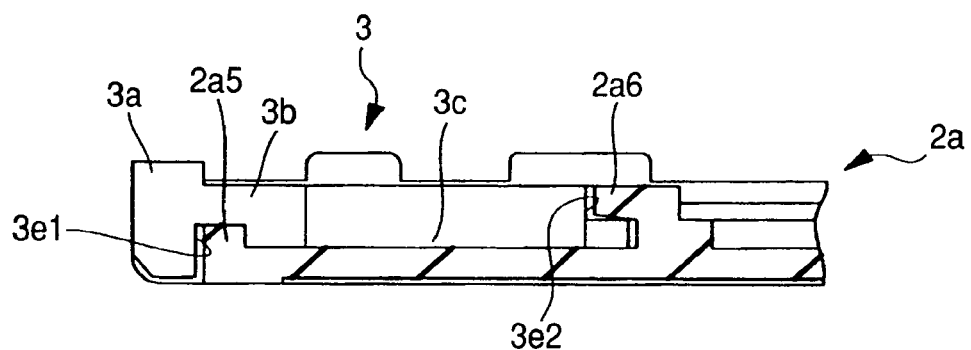
FIG. 19 is an enlarged sectional view of a principal portion of FIG. 18.
Figure 20:
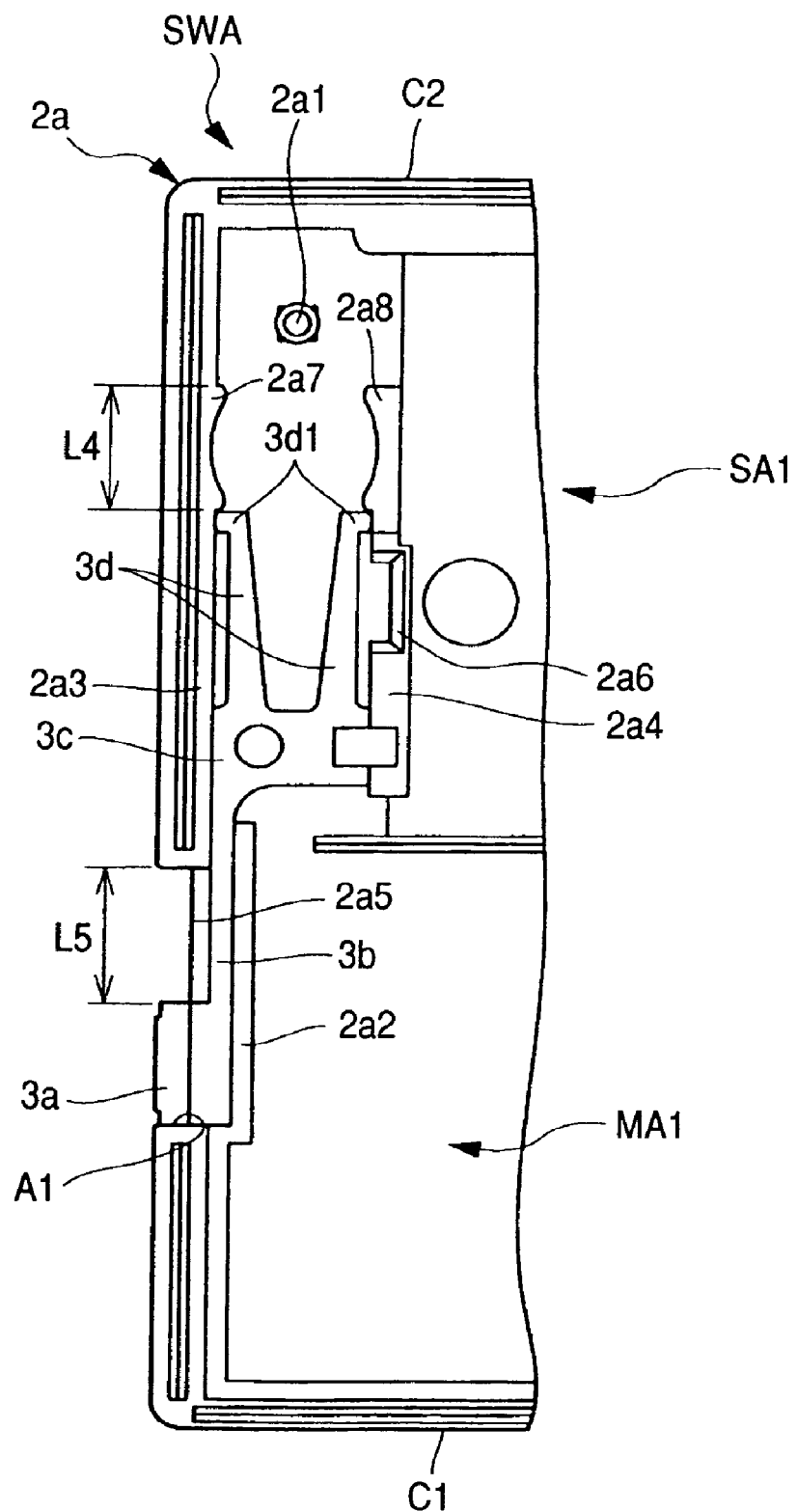
FIG. 20 is a plan view of a principal portion on the inner surface side of the first case, showing a state in which the switch mounted to the first case shown in FIG. 17 has been moved.

FIG. 15 is an entire plan view of the inner surface side of the first case 2a, FIG. 16 is a sectional view taken on line X2-X2 in FIG. 15, FIG. 17 is an entire plan view showing a loaded state of the switch 3 to a switch mounting area SWA formed on the inner surface of the first case 2a shown in FIG. 16, FIG. 18 is a sectional view taken on line X2-X2 in FIG. 17, FIG. 19 is an enlarged sectional view of an area G in FIG. 18, and FIG. 20 is a plan view of a principal portion of the inner surface side of the first case 21, showing a moved state of the switch 3 mounted to the first case 2a in FIG. 17. In FIGS. 15 and 17, a raised thicker portion than the other planar portion is hatched. The inner surface of the first case 2a has a first area MA1 and a second area SA1. The first area MA1 is an area in which the memory body 4 is disposed and which is formed so as to permit the memory body 4 to be received therein in a satisfactory manner. In the memory card 1 of this embodiment, a planar outline of the memory body 4 is smaller than that of each of the first and second cases 2a, 2b, whereby a sufficient space for the second area SA1 can be ensured. Therefore, the second area SA1 can be endowed with various other functions than the function of receiving the memory body 4 therein. More specifically, the second area SA1 has, for example, three projecting portions 21a and a switch mounting area SWA. The three projecting portions 2a1 extend in a direction perpendicular to the inner surface of the first case 2a. The three projecting portions 2a1 are functional portions having not only a function of serving as a temporarily fixing pin for fixing the first case 2a temporarily to a carrier tape to be described later but also a function of aligning a planar relative position of the first case 2a and that of the second case 2b with each other at the time of assembling the memory card 1, and a function of bonding both cases 2a and 2b with each other. Tips of the projecting portions 2a1 are chamfered, whereby, at the time of positioning and bonding the first and second cases 2a, 2b, the projecting portions 2a1 of the first case 2a can be fitted into recess portions of the second case 2b smoothly in a self-alignment manner. The three projecting portions 2a1 are each formed in a circular shape in plan, of which two are disposed near both corners of the second end side C2, while the remaining one projecting portion is disposed centrally in the transverse direction of the first case 2a on the midline CL side. That is, the three projecting portions 2a1 are positioned respectively at vertices of a triangle. They are arranged so as not to be aligned with one another not only when seen from a side face of the first case 2a but also when seen from the first and second end sides C1 and C2 of the first case 2a. By arranging the projecting portions 2a1 in such a dispersed fashion it is possible to improve the stability when the first case 2a is attached to a carrier tape to be described later. In this embodiment, as will be described later, when assembling the memory card 1, the first case 2a, as an example, is moved from the second end side C2 toward the first end side C1 so as to become horizontal with respect to the plane thereof and is taken out from the carrier tape, then is superimposed on the second case 2b. Therefore, the projecting portions 2a1 are dispersed so that one corner of the aforesaid triangle faces the moving direction of the first case 2a. According to this layout, the first case 2a can be taken out from the carrier tape smoothly without imposing any wasteful force on the tape. Further, since there are three projecting portions 2a1, the first case 2a can be mounted to the later-described carrier tape without making a mistake in which direction the case is to be mounted. The positions of the projecting portions 2a1 and the number thereof are not limited to those described above. The number of the projecting portions 2a1 may be two or less, or four or more, but three is preferred when the stability of the first case 2a as mounted to the carrier tape, the easiness of removing the first case 2a from the carrier tape, the alignability of the first and second cases 2a, 2b, and the elimination of error in the mounting direction, are taken into account.

The switch mounting area SWA of the first case 2a is an area where the switch 3 is disposed and which is formed so as to permit the switch 3 to be received therein in a satisfactory manner. When one of both longitudinal ends of the exposed surface portion 3a of the switch 3 is in proximity to one of both longitudinal ends of the groove A1, this state (see FIGS. 17 and 20) corresponds to write enable or write disable. In the memory card 1 of this embodiment, as described above, since a planar outline of the memory body 4 is smaller than that of each of the first and second cases 2a, 2b, it is possible to ensure a sufficient space of the switch mounting area SWA, thus permitting the switch 3 to have various functions as will be described later. In the switch mounting area SWA there are provided guide portions 2a2, 2a3, 2a4 and projecting portions 2a5, 2a6, 2a7, 2a8. The guide portions 2a2, 2a3, and 2a4 function to specify the area where the switch 3 is to be disposed and assisting a sliding motion of the switch. When seen in plan, the guide portions 2a2, 2a3, and 2a4 are formed so as to extend in the longitudinal direction of the first case 2a, while when seen in section, they are formed so as to extend in a direction perpendicular to the inner surface of the first case 2a. The guide portions 2a3 and 2a4 are erected on the inner surface of the first case 2a in parallel with and in opposition to each other. The projecting portion 2a5 is formed in the portion of the first case 2a where the groove A1 is formed, and when seen in plan, the projecting portion 2a5 is formed so as to extend in the longitudinal direction of the first case 2a, while when seen in section, it is formed so as to project in a direction perpendicular to the inner surface of the first case 2a. As shown in FIGS. 17 to 19, the projecting portion 2a5 is fitted in the recess portion 3e1 of the switch 3, whereby the switch 3 can be moved linearly along a rail formed by the projecting portion 2a5, thus permitting the switch 3 to be operated in a stable state.

The projecting portion 2a6 is formed in part of the guide portion 2a4 of the switch mounting area SWA. When seen in plan, the projecting portion 2a6 is formed so as to extend in the longitudinal direction of the first case 2a, while when seen in section, it is formed so as to extend in a direction parallel to the inner surface of the first case 2a. As shown in FIGS. 17 to 19, the projecting portion 2a6 is fitted in the recess portion 3e2 of the switch 3, whereby the switch 3 can be moved linearly along a rail formed by the projecting portion 2a6. By fitting the projecting portion 2a6 of the first case 2a into the recess portion 3e2 of the switch 3 when the switch is mounted to the first case, the switch can be temporarily fixed to (held by) the first case 2a. Consequently, as will be described later, the assembling process for the memory card 1 can be simplified and hence it becomes possible to improve the productivity of the memory card 1.

Further, the projecting portions 2a7 and 2a8 have a function of defining a write enable/disable boundary in the switch 3, a click function of the switch 3, and a temporarily fixing (holding) function for the switch 3. The projecting portions 2a7 and 2a8 are formed in part of side faces of the guide portions 2a3 and 2a4, and when seen in plan, the projecting portions 2a7 and 2a8 are formed so as to extend in parallel with each other in the longitudinal direction of the first case 2a and project in a direction perpendicular to the side faces of the guide portions 2a3 and 2a4. The projecting portions 2a7 and 2a8, in a relative planar positional relation thereof to the switch 3, are provided in such a manner that the exposed surface portion 3a of the switch 3 is located in switch ON or OFF position when the projecting portions 3d1 of the plate spring portions 3d of the switch 3 lie in positions deviated from both longitudinal ends of the projecting portions 2a7 and 2a8. As shown in FIG. 20, a longitudinal length L4 of each of the projecting portions 2a7 and 2a8 is set almost equal to a length L5 from one of both ends of the groove A1 to one end of the exposed surface portion 3a opposed thereto. A planar opposition spacing between the projecting portions 2a7 and 2a8 is set so as to become gradually narrower from a longitudinal center of each of the projecting portions 2a7 and 2a8 toward both end portions and in such a manner as to be smaller in any position than the distance between tips of the projecting portions 3d1 of the two plate spring portions 3d in the switch 3. Thus, for ON-OFF switching of the switch 3, it is necessary to get over the barrier defined by the projecting portions 2a7 and 2a8, that is, the application of a certain degree of force is required (the function of forming an ON-OFF boundary of the switch 3). Without the projecting portions 2a7 and 2a8, the exposed surface portion 3a of the switch 3 would easily move in the vertical direction in FIGS. 17 and 20, failing to fulfill the function of the switch, and the data stored in the memory card 1 might be erased against the user's will.

Just before the switch 3 is switched to ON or OFF, the projecting portions 3d1 of the two plate springs 3d of the switch 3 pass through a portion where the opposed spacing of the projecting portions 2a7 and 2a8 is relatively narrow, so that the plate springs 3d undergo an urging force toward each other. But the projecting portions 3d1 of the plate spring portions 3d are disengaged from ends of the projecting portions 2a7 and 2a8 the moment the switch 3 is switched to ON or OFF, so that the plate spring portions 3d are restored to their original state by virtue of the resulting repulsive force (resilience). At this time, the user of the memory card 1 can actually feel, with his or her finger-tip or ears, a small shock or sound which occurs when the plate spring portions 3d return to their original state, whereby the user can make sure that the switch 3 has been set to ON or OFF (click function of the switch 3). Thus, it is possible to prevent erasing of the data stored in the memory card 1 which is caused by failure to be firmly set ON or OFF of the switch. Further, when the switch 3 is mounted in such a manner that the projecting portions 3d1 of the plate spring portions 3d of the switch come into contact with the projecting portions 2a7 and 2a8, the plate spring portions 3d receive from the projecting portions 2a7 and 2a8 such an urging force as makes them come close to each other, so that the repulsive force (resilience) from the plate spring portions 3d is applied to the projecting portions 2a7 and 2a8. Therefore, if the switch 3 is mounted to the first case 2a so as to induce a repulsive force by the plate spring portions 3d of the switch 3, the switch 3 can be temporarily fixed to (held by) the first case 2a so as to prevent easy fall of the switch from the first case 2a (temporarily fixing (holding) function for the switch 3). As a result, the assembling process for the memory card 1 can be simplified and hence it becomes possible to improve the productivity of the memory card.

Besides, the memory card 1 of this embodiment is of the structure wherein the switch 3 is sandwiched in between the first and second cases 2a, 2b, and the memory body 4 is small, permitting a relatively wide area to be ensured as the switch mounting area SWA and hence permitting the switch 3 itself to be designed in a rather large size. Consequently, not only the handling of the switch is easy, but also it is possible to ensure holding of the switch 3 and stability of its operation even after the memory card assembling process. Thus, it is possible to diminish or prevent such an inconvenience as breakage of the switch portion in the memory card 1 after the assembling process. Accordingly, it is possible to improve the reliability and life of the memory card 1.

Figure 21:
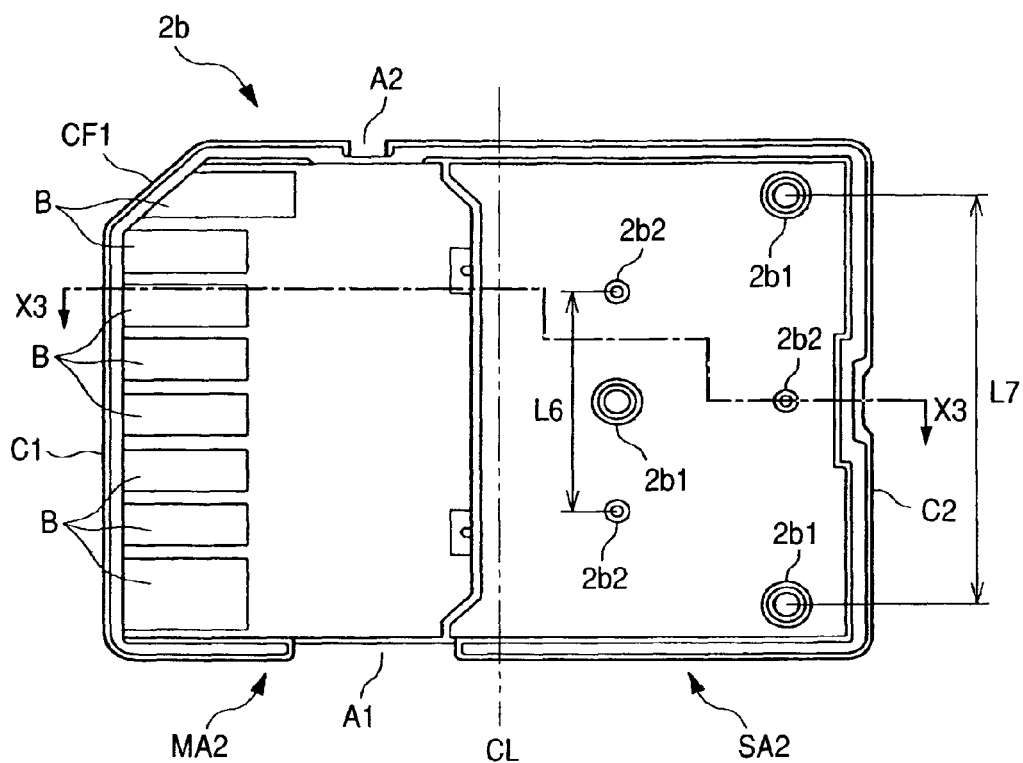
FIG. 21 is an entire plan view of the inner surface side of the second case in the IC card shown in FIGS. 1 to 3.
Figure 22:
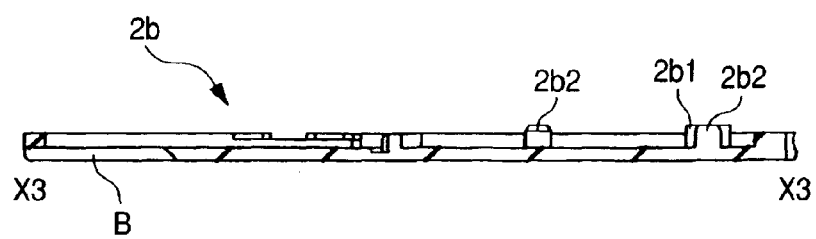
FIG. 22 is a sectional view taken on line X3-X3 in FIG. 21.
Figure 23:
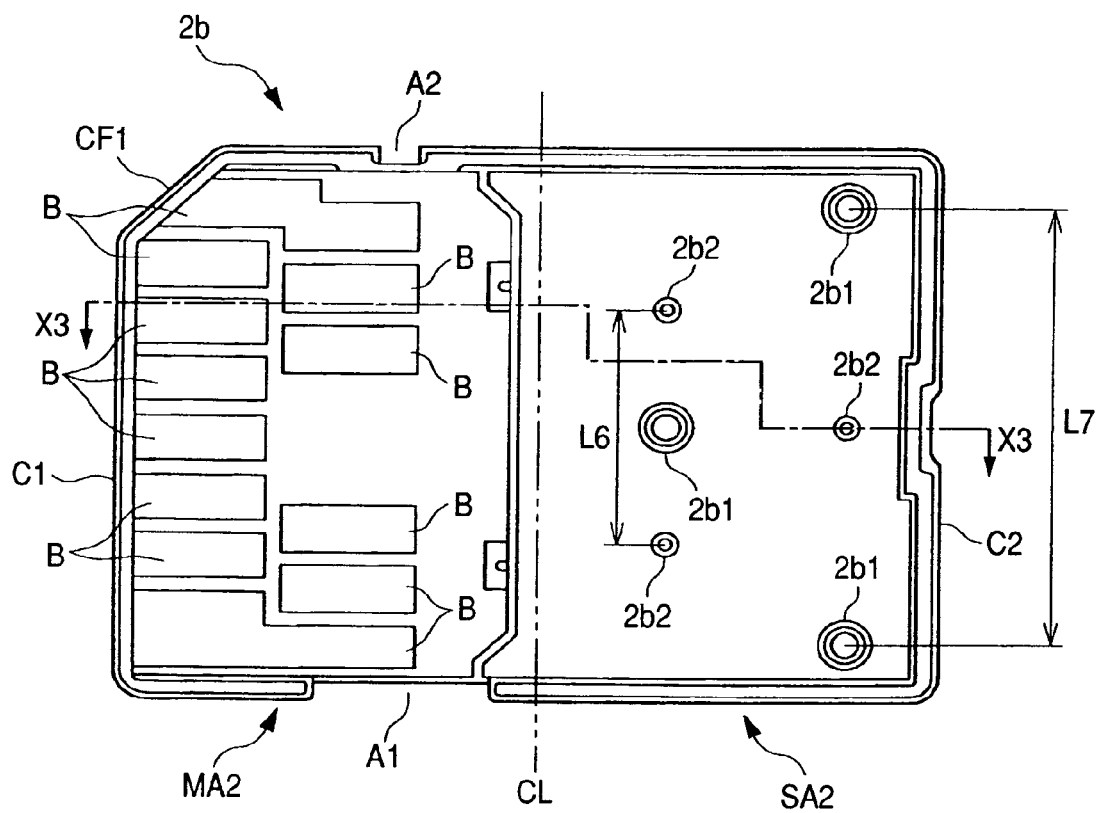
FIG. 23 is an entire plan view of an inner surface side of a second case different from that shown in FIG. 21 in the IC card shown FIGS. 1 to 3.
Figure 24:
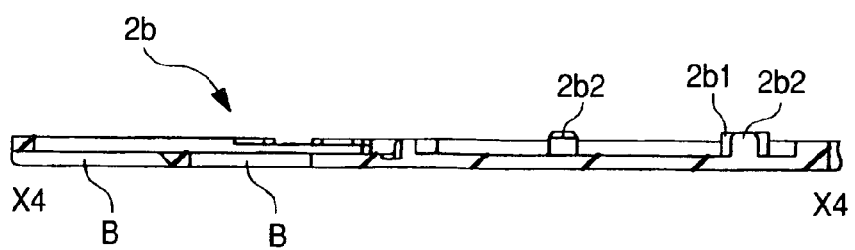
FIG. 24 is a sectional view taken on line X3-X3 in FIG. 23.
Figure 25:
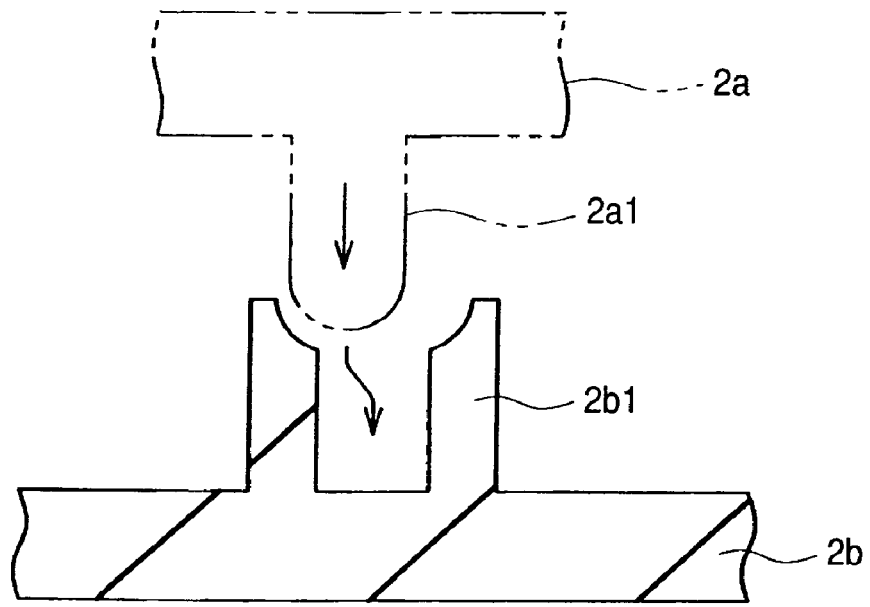
FIG. 25 is an enlarged sectional view of a principal portion of the second case shown in FIG. 21 or 23.
Figure 26:
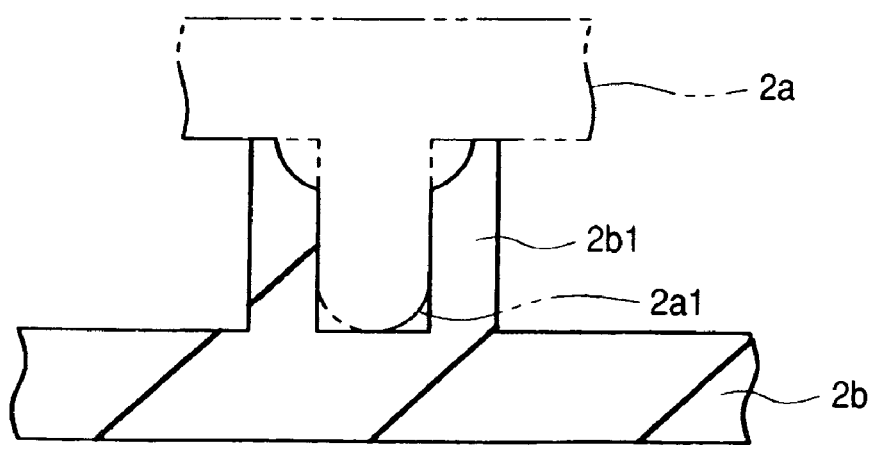
FIG. 26 is an enlarged sectional view of the principal portion of the second case shown in FIG. 21 or 23.

FIG. 21 is an entire plan view of the inner surface side of the second case 2b, FIG. 22 is a sectional view taken on line X3-X3 in FIG. 21, FIGS. 23 is an entire plan view of an inner surface side of a second case 2b different from that shown in FIG. 21, FIG. 24 is a sectional view taken on line X3-X3 in FIG. 23, and FIGS. 25 and 26 are enlarged sectional views of a principal portion of the second case 2b shown in FIG. 21 or 22. An inner surface of the second case 2b has a first area MA2 and a second area SA2. The first area MA2 is an area where the memory body 4 is disposed and which is formed so as to permit the memory body 4 to be received therein in a satisfactory manner. Plural apertures B are formed side by side near and along the first end side C1 of the first area MA2. For example, in FIG. 21, eight apertures B are formed side by side in a row along the first end side C1, and in FIG. 23, twelve apertures B are formed side by side in two rows along the first end side C1. Also in the second case 2b, as described above, since a planar outline of the memory body 4 is smaller than that of each of the first and second cases 2a, 2b, it is possible to ensure a sufficient space of the second area SA2 in the second case 2b. Consequently, it is possible to let the second area SA2 have various other functions than accommodating the memory body 4. For example, the second area SA2 has three recess portions 2b1 and three projecting portions 2b2.

The three recess portions 2b1, in which the projecting portions 2a1 of the first case 2a are fitted, have a function of aligning planar relative positions of the first and second cases 2a, 2b at the time of assembling the memory card 1 and a function of bonding both cases together. An upper side of an inner surface of each recess portion 2b1 is chamfered. Accordingly, as shown in FIGS. 25 and 26, even if the projecting portions 2a1 of the first case 2a are somewhat deviated positionally at the time of aligning and bonding the first and second cases 2a, 2b, it is possible to compensate for the positional deviation and let the projecting portions 2a1 of the first case 2a be fitted in the recess portions 2b1 of the second case 2b smoothly in a self-alignment manner. The recess portions 2b1 are each formed in a circular shape in plan, two of which are disposed near both corners of the second end side C2, while the remaining one is disposed centrally in the transverse direction of the second case 2b on the midline CL side. That is, the three recess portions 2b1 are positioned respectively at vertices of a triangle so as to registered with the planar positions of the three projecting portions 2a1. The positions of the recess portions 2b1 and the number thereof depend on the projecting portions 2a1, and no limitation is made to the above, as described earlier in connection with the projecting portions 2a1.

Figure 27:
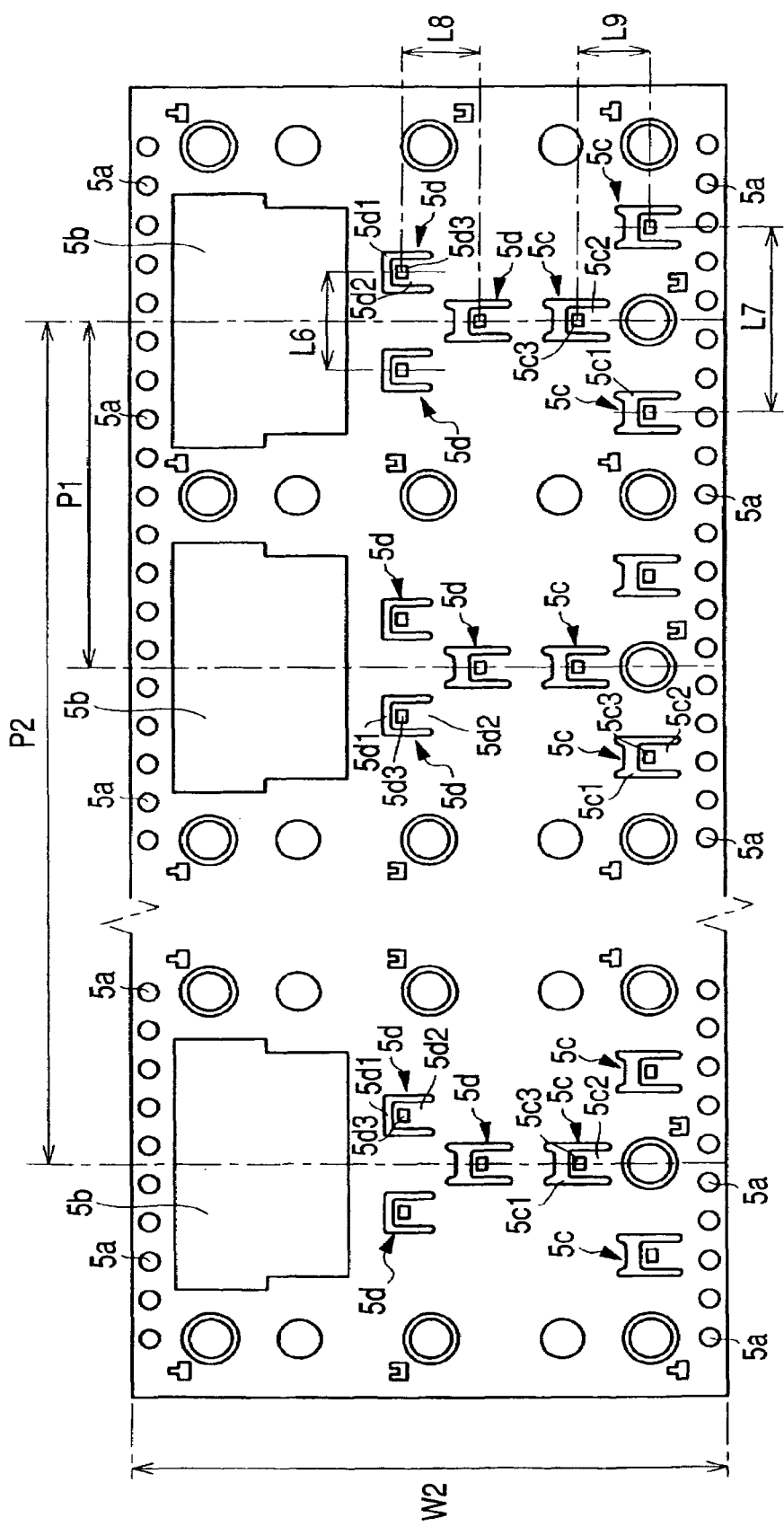
FIG. 27 is a plan view showing an example of a carrier used in assembling the IC card of the first embodiment.
Figure 28:
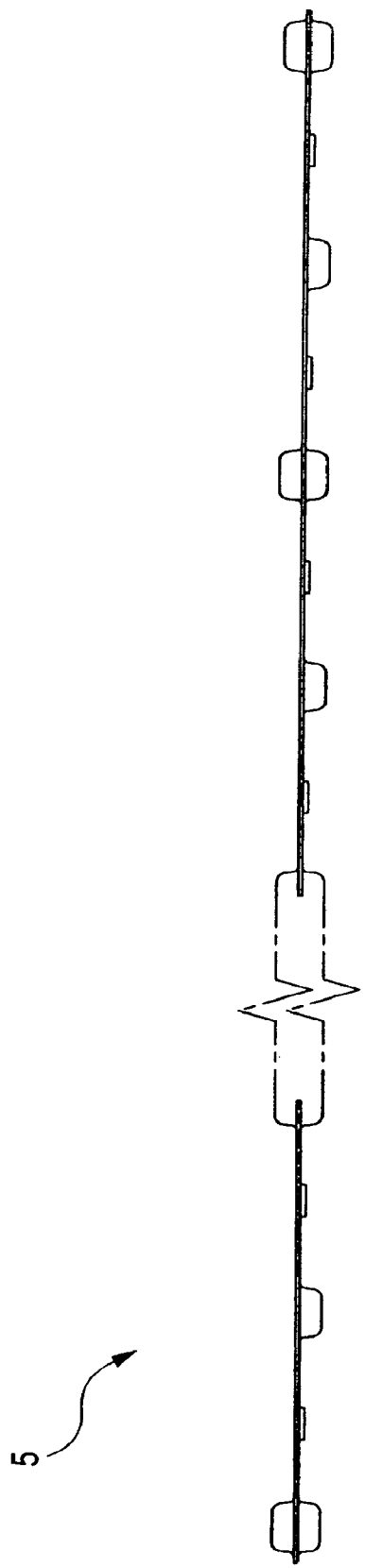
FIG. 28 is a side view in a longitudinal direction of the carrier shown in FIG. 27.
Figure 29:
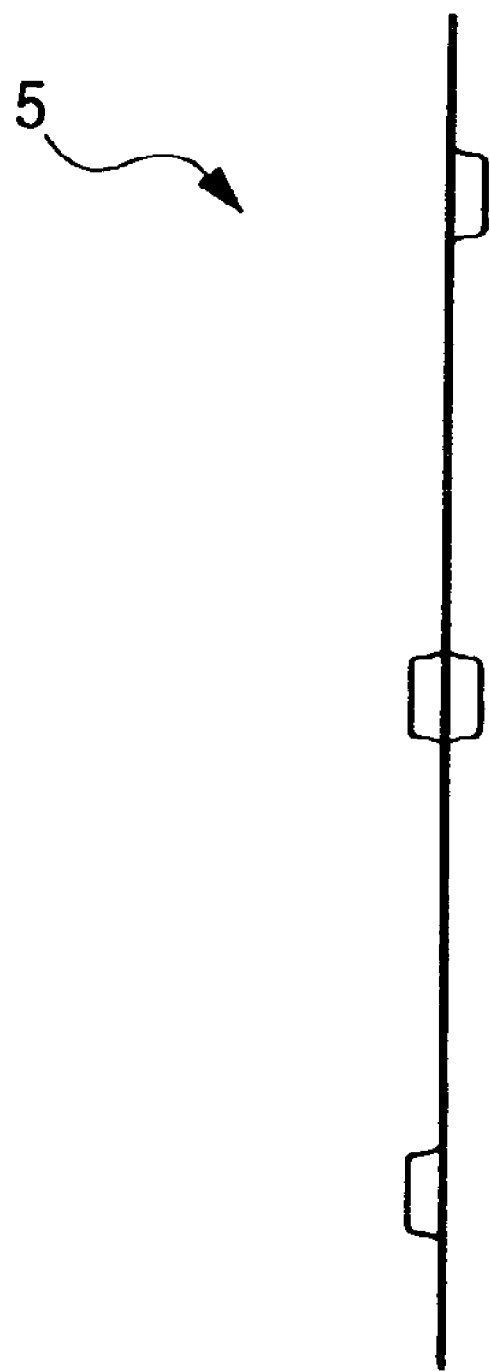
FIG. 29 is a side view in a transverse direction of the carrier shown in FIG. 27.
Figure 30:
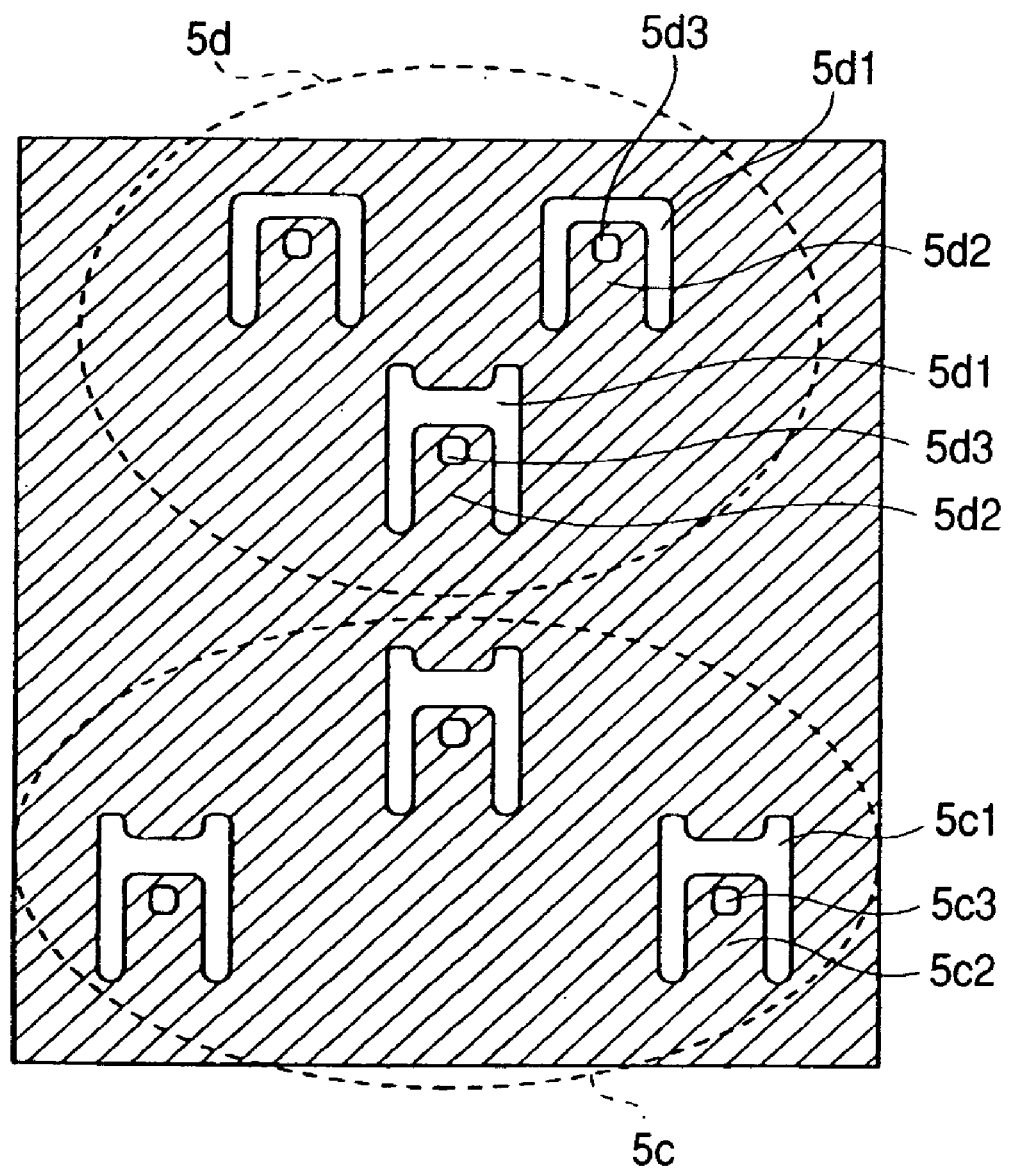
FIG. 30 is an enlarged plan view of a principal portion of the carrier shown in FIG. 27.
Figure 31:
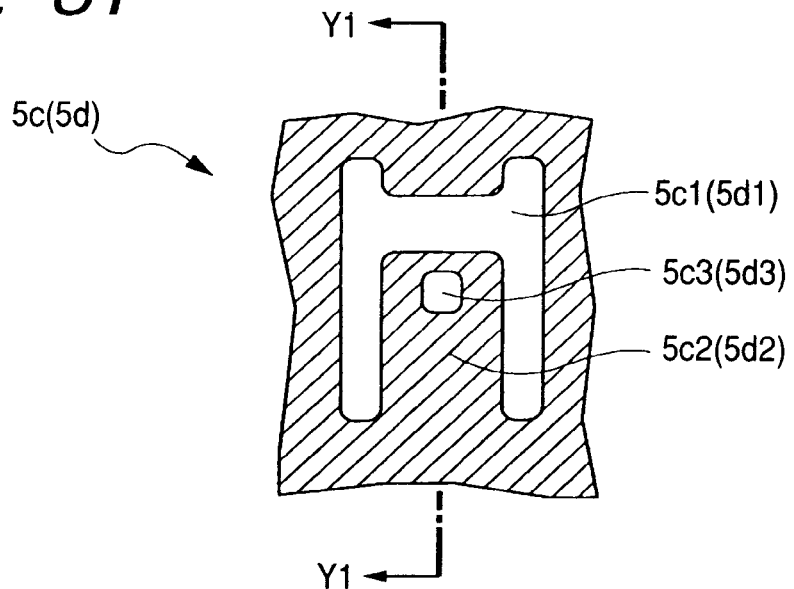
FIG. 31 is an enlarged plan view of a principal portion of the carrier shown in FIG. 30.
Figure 32:
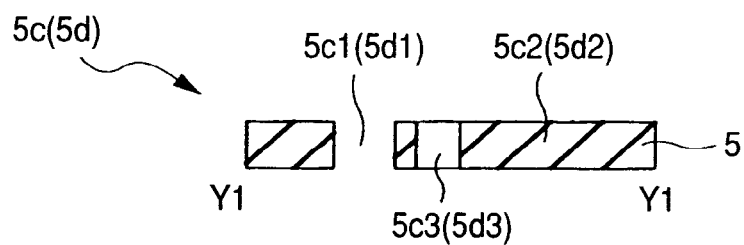
FIG. 32 is a sectional view taken on line Y1-Y1 in FIG. 31.
Figure 33:
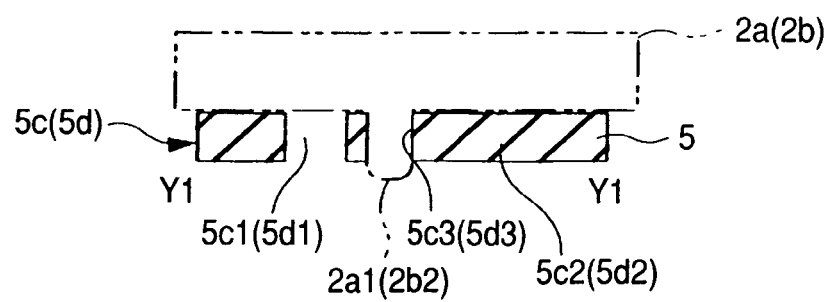
FIG. 33 is a sectional view taken on line Y1-Y1 in FIG. 31.

The three projecting portions 2b2 in the second area SA2 of the second case 2b extend in a direction perpendicular to the inner surface of the second case 2b and, for example, have a function as a temporary fixing pin for fixing the second case 2b temporarily to the carrier tape to be described later. Each of the three projecting portions 2b2 is chamfered on its tip side and is formed in a circular shape in plan. One of the three projecting portions 2b2 is disposed centrally in the transverse direction of the second case 2b near the second end side C2, while the remaining two are disposed on both sides of the recess portion 2b1 located on the midline CL side (above and below the recess portion 2b1 in FIGS. 21 and 23). That is, the three projecting portions 2b2 are also positioned at vertices of a triangle and are arranged so as not to be aligned with one another not only when seen sideways of the second case 2b but also when seen from the first and second end sides C1, C2 of the second case 2b. By thus arranging the projecting portions 2b2 in a dispersed fashion, it is possible to improve the stability of the second case 2b when attached to the carrier tape to be described later. However, the triangle defined by the three projecting portions 2b2 is disposed so as to face reverse to the triangle defined by the three projecting portions 2a1. As an example in this embodiment, as will be described later, the first case 2a is moved from the second end side C2 toward the first end side C1 so as to be horizontal with respect to the plane thereof at the time of assembling the memory card 1, then is taken out from the carrier tape and is superimposed on the second case 2b. At this time, the second case 2b is not moved and therefore the triangle defined by the three projecting portions 2b2 of the second case 2b is allowed to face reverse to the moving direction of the first case 2a, whereby when the first case 2a moves to the second case 2b side, it is possible to prevent the second case 2b from being disengaged from the carrier tape due to the resulting shock. Further, by reversely orienting the triangle defined by the projecting portions attached to the carrier tape, it is possible to avoid the occurrence of an error in mounting the first and second cases 2a, 2b such as mounting the second case 2b at the position where the first case 2a should be mounted. In connection with the relation between the projecting portions 2b2 and the recess portions 2b1, a distance L6 between the two projecting portions 2b2 located near the midline CL is shorter than a distance L7 between the two recess portions 2b1 located near corners of the second case 2b, and when seen from the first end side C1 or the second end side C2, the two projecting portions 2b2 located near the midline CL and the two recess portions 2b1 located near corners of the second case 2b are not aligned with each other, but are offset from each other. Moreover, the three projecting portions 2b2 are disposed relatively closer to one another than the three recess portions 2b1. Consequently, it is possible to avoid the occurrence of an error in mounting the first and second cases 2a, 2b such as mounting the second case 2b at the position where the first case 2a is to be mounted. The positions of the projecting portions 2b2 and the number thereof are not limited to the above. The number of the projecting portions 2b2 may two or less, or four or more, but when the stability of the first case 2a as mounted to the carrier tape, a numerical coincidence thereof with the number of the projecting portions 2a1 of the first case 2a, and the elimination of an error in the mounting direction, are taken into account, three is preferred. Next, a description will be given below about an example of the carrier tape which is used in the assembling process for the memory card 1 of this embodiment. FIG. 27 is a plan view of the carrier tape (carrier) indicated at 5, FIG. 28 is a side view in the longitudinal direction of the carrier tape 5 shown in FIG. 27, FIG. 29 is a side view in the transverse direction of the carrier tape 5 shown in FIG. 27, FIG. 30 is an enlarged plan view of a principal portion of the carrier tape 5 shown in FIG. 27, FIG. 31 is an enlarged plan view of a principal portion of the carrier tape 5 shown in FIG. 30, and FIGS. 32 and 33 are sectional views taken on line Y1-Y1 in FIG. 31.

The carrier tape 5 is formed by a flexible film of an insulator such as PET (polyethylene terephthalate), a polyimide resin, a glass fabric-based epoxy resin, BT resin, or a polyester, or of a metal such as stainless steel or aluminum. The carrier tape 5 is wound round a reel for conveyance. Particularly, in the case where the carrier tape 5 is disposable, it is preferable to use PET which is low in cost and easy to handle. On the other hand, in the case where the carrier tape 5 is to be recycled, it is preferable to use a metal superior in durability such as aluminum or stainless steel. By selecting any of the metals referred to above and by electrically connecting the carrier tape 5 with a ground potential, it is possible to let static electricity generated in the carrier tape 5 escape to the ground potential for example through the carrier tape 5, so that it is possible to suppress or prevent electrostatic breakdown of the memory body 4 on the carrier tape 5 after receiving therein of the memory body 4. Near both longitudinal sides of the carrier tape 5 there are formed plural sprocket holes 5a extending through both upper and lower surfaces of the carrier tape 5. Pawls of a sprocket wheel are engaged with the sprocket holes 5a and the sprocket wheel rotates in this state, whereby the carrier tape 5 can be fed with a high accuracy. Near one longitudinal end of the carrier tape 5 are formed plural apertures 5b at a predetermined certain pitch P1 in the longitudinal direction of the carrier tape so as to extend through upper and lower surfaces of the carrier tape. For example, the pitch P1 is about 36 mm. In this embodiment, ten apertures 5b are formed in the carrier tape 5 and therefore a pitch P2 between both-end apertures 5b in the carrier tape 5 is, for example, about 324 mm. In the assembling process of the memory card 1, the memory body 4 is received in the first area MA2 of the second case 2b through each aperture 5b. The area where each aperture 5b is formed in the carrier tape 5 is a unit area used in assembling one memory card 1.

Case mounting portions 5c and 5d are formed in each unit area of the carrier tape 5. The case mounting portions 5c are means for fixing the first case 2a temporarily to the upper surface side of the carrier tape 5, and three case mounting portions 5c are provided to match the planar positions of the three projecting portions 2a1 of the first case 2a. The case mounting portions 5d are means for fixing the second case 2b temporarily to the lower surface side of the carrier tape 5, and three case mounting portions 5d are provided to match the planar positions of the three projecting portions 2b2 of the second case 2b. The planar positions of the case mounting portions 5c and 5d are offset in the transverse direction of the carrier tape 5. This is because of the necessity that the first and second cases 2a, 2b should be offset in the transverse direction of the carrier tape 5. Although the length L6 is shorter than the length L7 as described above, a length L8 as a pitch between adjacent case mounting portions 5d in the transverse direction of the carrier tape 5 is equal to a length L9 as a pitch between adjacent case mounting portions 5c in the transverse direction of the carrier tape. Each case mounting portion 5c has an aperture 5c1 which is horseshoe-shaped in plan, a projecting portion 5c2 defined by the aperture 5c1, and a hole 5c3 formed near the tip of the projecting portion 5c2. Each case mounting portion 5d, which is also of the same structure, has an aperture 5d1 of horseshoe shape in plan, a projecting portion 5d2 defined by the aperture 5d1, and a hole 5d3 formed near the tip of the projecting portion 5d2. The projecting portions 2a1 of the first case 2a are inserted into the holes 5c3 and the projecting portions 2b2 of the second case 2b are inserted into the holes 5d3, whereby the first and second cases 2a, 2b are fixed to the carrier tape 5 temporarily.

The projecting portions 5c2 and 5d2 are all arranged so as to project toward the apertures 5b. That is, the projecting portions 5c2 and 5d2 are arranged so as to project in a direction in which the first and second cases 2a, 2b are moved when both cases are removed from the carrier tape 5. In the moving direction of the first and second cases 2a, 2b the carrier tape 5 and the projecting portions 5c2, 5d2 are separated from each other by the apertures 5c1 and 5d1. According to this construction, when the first and second cases 2a, 2b are moved so as to be horizontal with respect to the plane of the carrier tape 5, the resin portions between the tips of the projecting portions 5c2, 5d2 and the holes 5c3, 5d3 are cut off, whereby the first and second cases 2a, 2b can be removed from the carrier tape 5 in a satisfactory manner. Further, the construction using the apertures 5c1, 5d1 and the projecting portions 5c2, 5d2 permits the first and second cases 2a, 2b to have a margin against a force acting thereon in a direction perpendicular to the plane of the carrier tape 5, so that it is possible to prevent easy disengagement of the first and second cases 2a, 2b from the carrier tape 5 when the carrier tape is wound round a reel or the like.

Next, an example of an assembling method for the memory card of this embodiment will be described below with reference to the process chart of FIG. 34.

Figure 35:
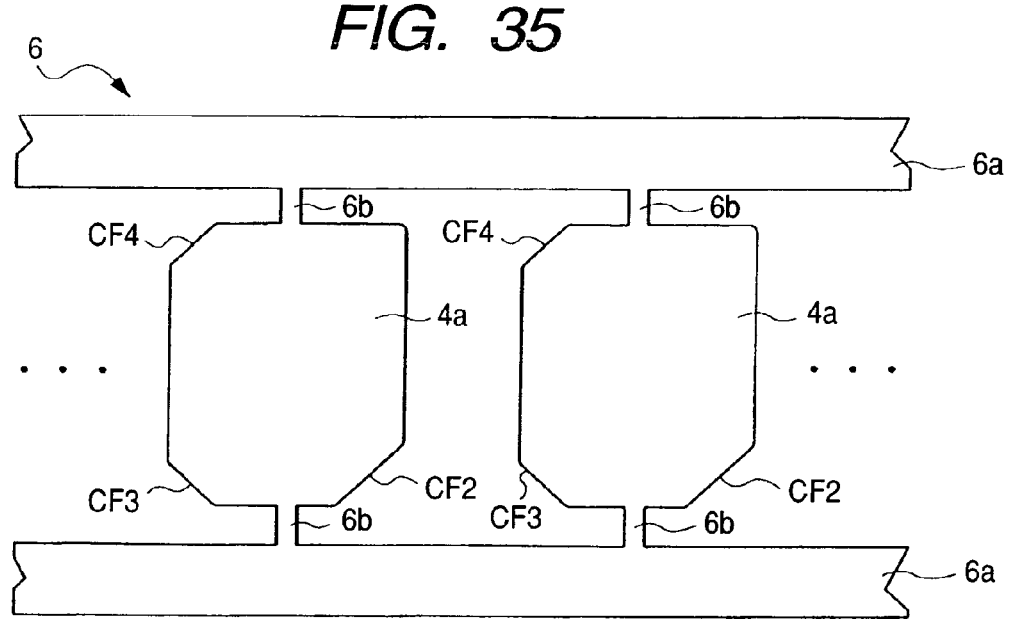
FIG. 35 is a plan view of main surfaces of wiring substrates in an assembling process for the IC body of the IC card of the first embodiment.
Figure 36:
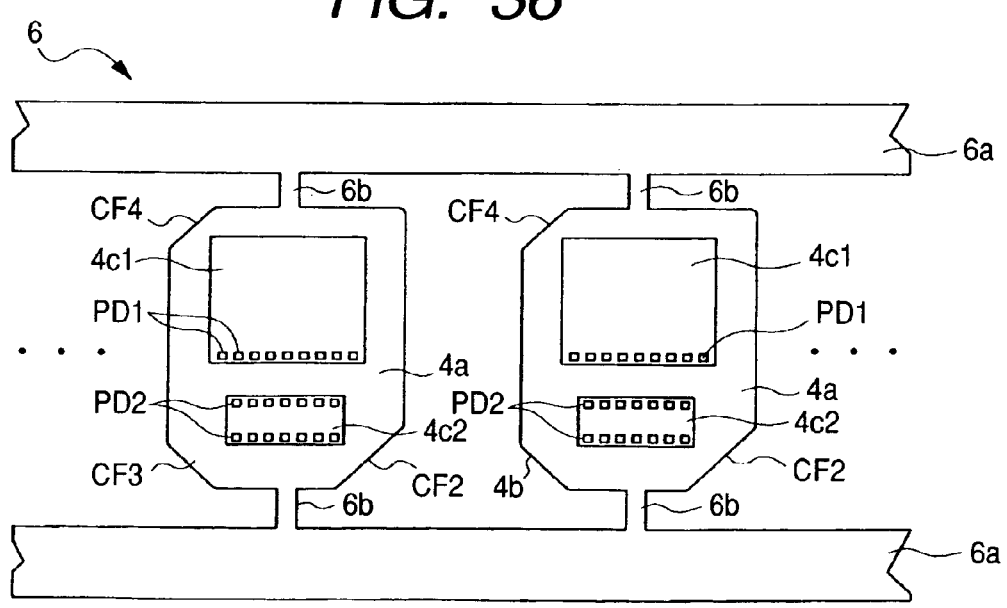
FIG. 36 is a plan view of a main surface of a substrate frame in the assembling process for the IC body of the IC card which follows FIG. 35.
Figure 37:
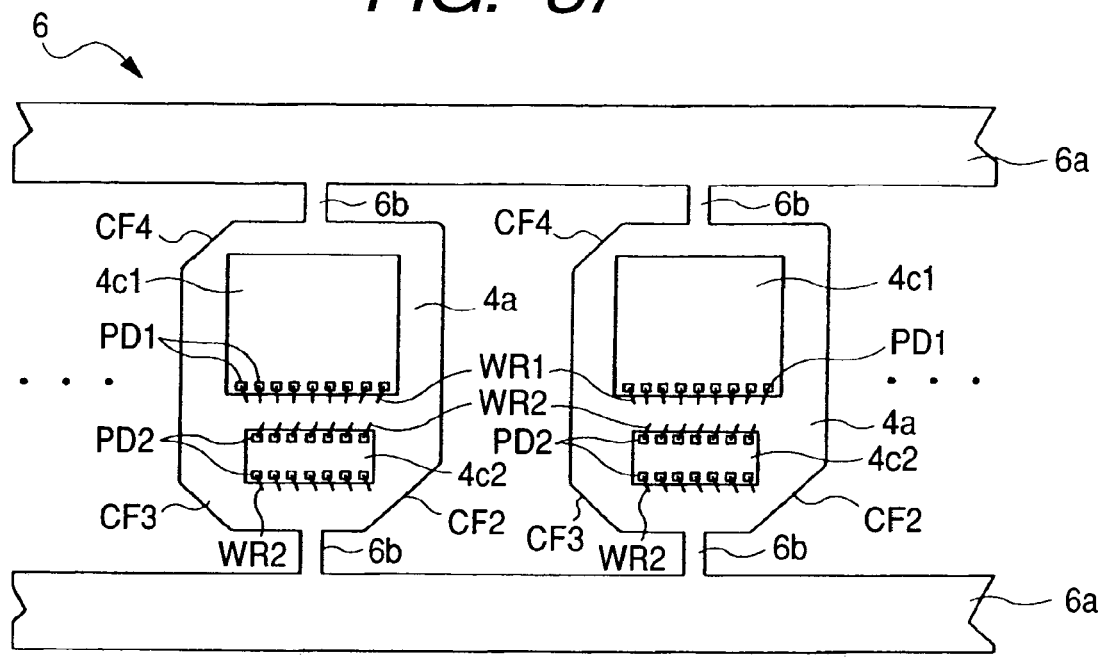
FIG. 37 is a plan view of the main surface of the substrate frame in the assembling process for the IC body of the IC card which follows FIG. 36.
Figure 38:
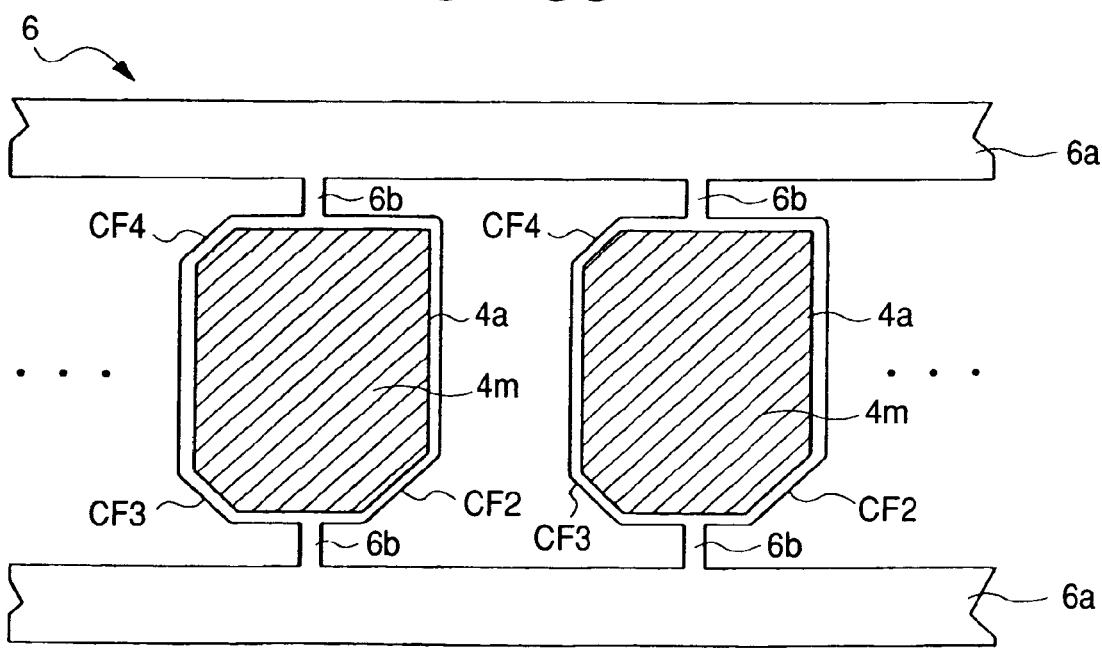
FIG. 38 is a plan view of the main surface of the substrate frame in the assembling process for the IC body of the IC card which follows FIG. 37.
Figure 39:
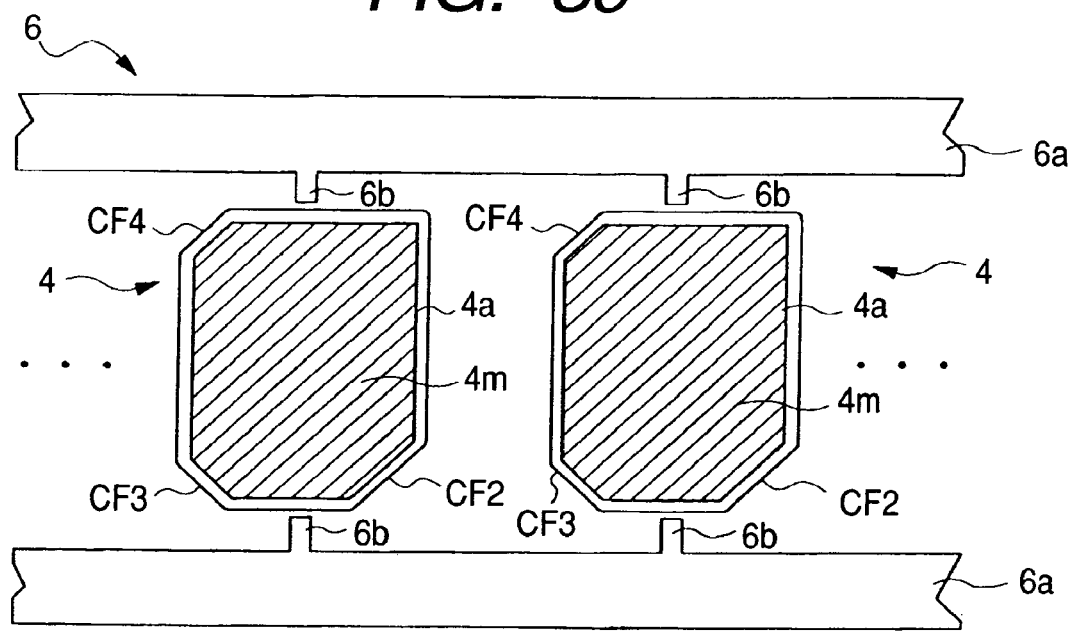
FIG. 39 is a plan view of the main surface of the substrate frame in the assembling process for the IC body of the IC card which follows FIG. 38.

First, an assembling process 100 for the memory body 4 shown in FIG. 34 will be described with reference to FIGS. 35 to 39. FIGS. 35 to 39 are plan views of a main surface of a substrate frame 6 in the assembling process. First, as shown in FIG. 35, a paper strip-like substrate frame 6 is provided. Plural wiring substrates 4a are connected beforehand to frame portions 6a of the substrate frame 6 through fine connections 6b which are connected to central positions in two short sides of each wiring substrate 4a. In this stage, the frame portions 6a, the connections 6b, and each wiring substrate 4a are integral with one another. Chamfered portions CF2 to CF4 of each wiring substrate 4a are also formed in advance. Subsequently, as shown in FIG. 36, chips 4c1 and 4c2 are mounted on a main surface of each wiring substrate 4a in the substrate frame 6 (step 101 in FIG. 34). At this time, the chip 4c1, which is relatively large and which is for memory, is mounted at a position spaced apart from the chamfered portion CF2, while the chip 4c2, which is relatively small and which is for controller, is mounted at a position close to the chamfered portion CF2. Thereafter, for example plasma cleaning is performed to clean the surface of wiring and electrodes (including pads PD1 and PD2) on the wiring substrate 4a and the chips 4c1, 4c2. This step mainly aims at cleaning the surface of a gold plated layer which is formed thin and thereby keeping the connection between the wires and the gold plated layers in a satisfactory condition in a wire bonding step which follows the step in question. Then, as shown in FIG. 37, in each wiring substrate 4a, pads PD1 and PD2 on the chips 4c1 and 4c2 are electrically connected to wiring and electrodes on the wiring substrate 4a through bonding wires WR1 and WR2 (step 102 in FIG. 34). Subsequently, as shown in FIG. 38, the chips 4c1, 4c2 on the plural wiring substrates 4a and the bonding wires WRI, WR2 are sealed together by a transfer molding method to form sealing members 4m on the wiring substrates 4a respectively (step 103 in FIG. 34). From the standpoint of improving the adhesion of the sealing members 4m, the foregoing cleaning process may be applied to the wiring substrates 4a after the wire bonding step and before the molding step. Thereafter, as shown in FIG. 39, connections 6b are cut off to separate the wiring substrates 4a from the substrate frame 6 (step 104 in FIG. 34) In this way there are produced the memory bodies 4, which may be stocked in a carrier vessel or the like. Here a description will be given about the case where the plural memory bodies 4 thus fabricated are conveyed to a memory card assembling process which follows, and the same process is to be carried out.

In the memory card assembling process, it is determined whether a memory card to be assembled is in conformity with the multi-media card (simply as MMC hereinafter) standard or SD card standard (step 201 in FIG. 34). If the answer is MMC, it is further determined whether the memory card is a full-size (simply as Full Size: FS hereinafter) MMC or a reduced size (simply as Reduced Size: RS hereinafter) MMC (step 202 in FIG. 34).

Figure 34:
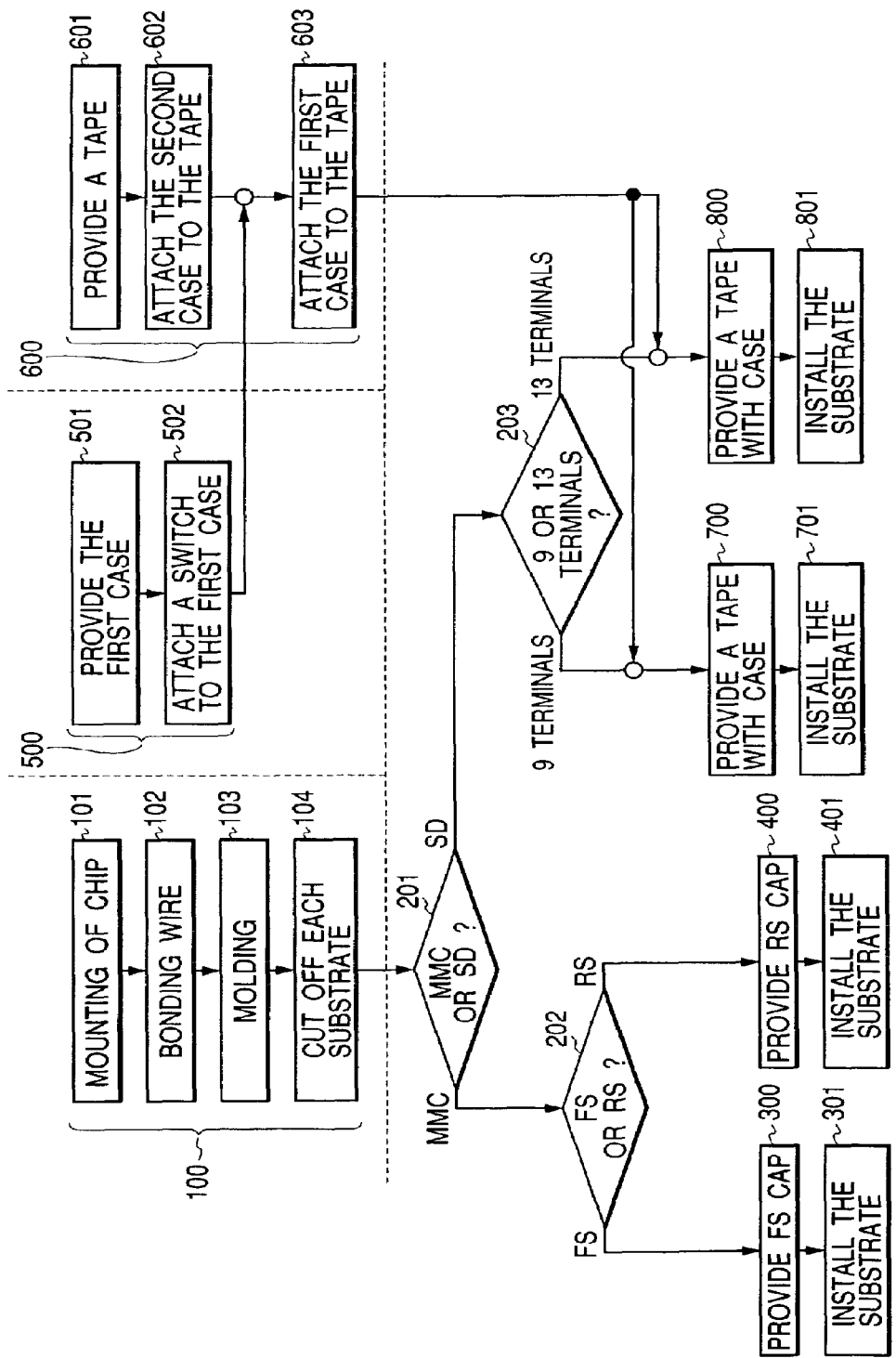
FIG. 34 is a process chart showing an example of an assembling process for the IC card of the first embodiment.
Figure 40:
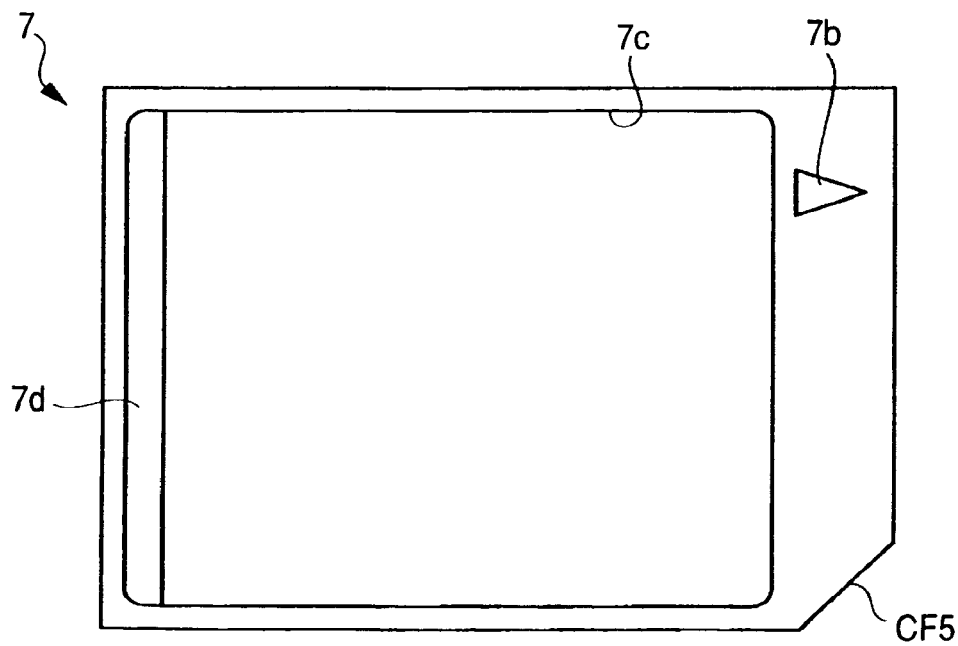
FIG. 40 is a plan view of a surface of a cap which is provided in the assembling process for the IC card of the first embodiment.
Figure 41:
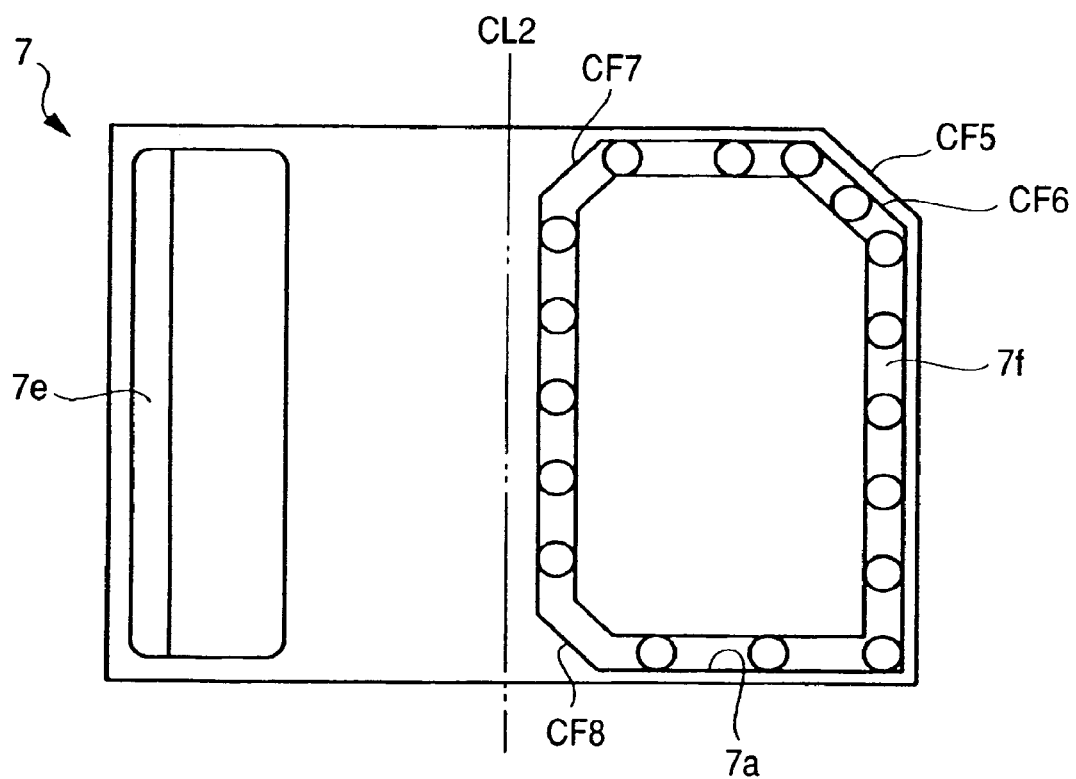
FIG. 41 is a plan view of a back side of the cap shown in FIG. 40.

If the answer is FSMMC, there is provided such a cap 7 for FSMMC as shown in FIGS. 40 and 41 (step 300 in FIG. 34). FIGS. 40 and 41 are plan views of a surface and a back side, respectively, of the cap 7. For the standpoint of attaining the reduction of weight, easy machinability and flexibility, the cap 7 is formed of a resin having an insulating property such as ABS resin or PPE (polyphenylene ether). One corner of a front side of the cap 7 is chamfered to form a chamfered portion CF5 for index. The chamfered portion CF5 for index is standardized and has a function of making a loading direction easier to recognize at the time of loading the full-size MMC into a desired electronic device. A groove 7a is formed in the back side of the cap 7 and on the side where the chamfered portion CF5 is formed. The groove 7a, in order for the memory body 4 to be fitted therein in a satisfactory manner, is formed in the same planar shape as and in a somewhat larger planar size than the wiring substrate 4a of the memory body 4. A transverse length of the groove 7a is set smaller than half of a longitudinal length of the cap 7. In the groove 7a, one corner located on the front side of the cap 7 is chamfered along the chamfered portion CF5 of the cap 7 to form a chamfered portion CF6. Likewise, two longitudinal corners of the cap 7 located near the midline CL2 are chamfered to form chamfered portions CF7 and CF8, which are smaller than the chamfered portion CF6 and which are mutually symmetric right and left. The numeral 7b denotes a mark triangular in plan which is for indicating in which direction the FSMMC is to be loaded into a desired electronic device, the numeral 7c denotes a depression for sticking thereon of a seal or the like which is for describing various information pieces such as, for example, classification of the FSMMC, and the numerals 7d and 7e denote card extracting grooves, and the numeral 7f denotes a stepped portion.

Figure 42:
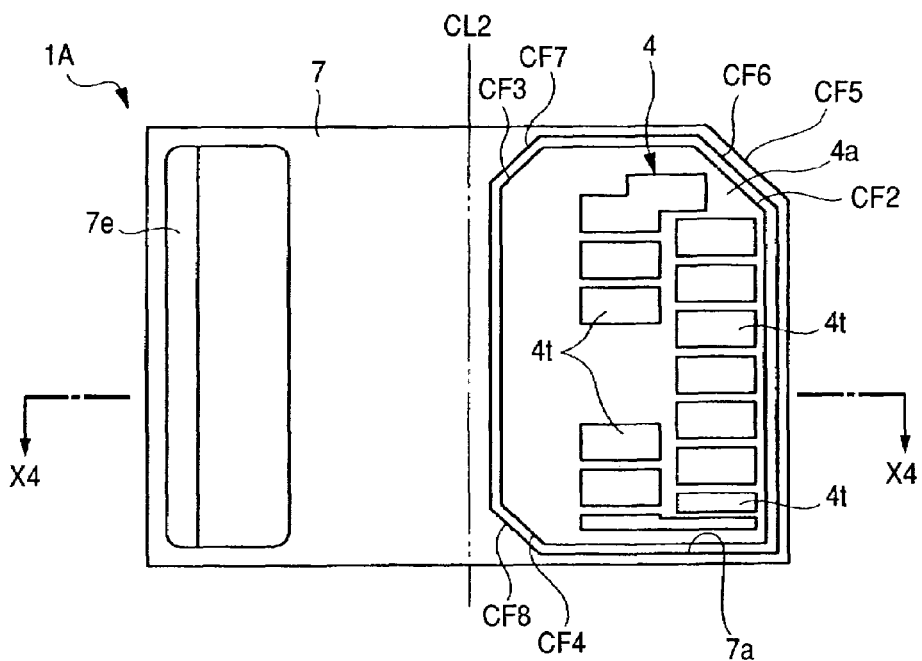
FIG. 42 is a plan view of the back side of the IC card assembled using the cap shown in FIGS. 40 and 41.
Figure 43:
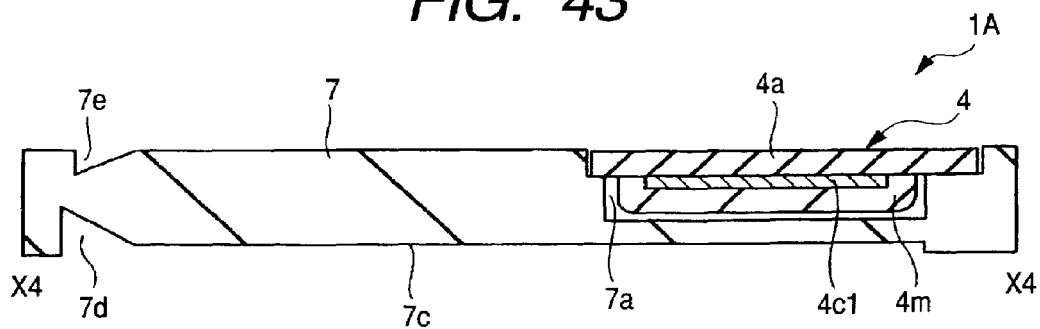
FIG. 43 is a sectional view taken on line X4-X4 in FIG. 42.

Then, in the FSMMC assembling process, as shown in FIGS. 42 and 43, the memory body 4 is installed into the groove 7a of the cap 7 and is fixed with an adhesive to assemble FSMMC 1A (step 301 in FIG. 34). FIG. 42 is a plan view of a back side of FSMMC 1A and FIG. 43 is a sectional view taken on line X4-X4 in FIG. 42. External dimensions of FSMMC 1A are, for example, 32 mm in long side, 24 mm in short side, and 1.4 mm in thickness. With cap 7 alone, the FSMMC 1A is simpler to assemble and is thinner than the memory card 1 described above. Here there is illustrated the use of such a 13-terminal type memory body 4 as shown in FIG. 4. Also in the FSMMC 1A, the memory body 4 is smaller than half in the longitudinal direction of the cap 7, so as described earlier in connection with the memory card 1, it is possible to suppress or prevent deterioration and breakage of the memory body 4 (wiring substrate 4a and semiconductor chips) caused by a bending stress and hence possible to improve the reliability and service life of the FSMMC 1A. Besides, since chamfered portions CF7 and CF8 are formed at corners of the groove 7a in the cap 7, it is possible to make the length of contact between the wiring substrate 4a and the groove 7a longer than in the absence of the chamfered portions CF7 and CF8 and hence possible t improve the strength of bonding between the wiring substrate 4a and the cap 7. Moreover, since chamfered portions CF3 and CF4 are formed in the wiring substrate 4 and chamfered portions CF7 and CF8 are formed correspondingly in the groove 7a of the cap 7 to eliminate a right-angled portion where stress concentration is apt to occur, it is possible to disperse a stress. Consequently, in a bending strength test for FSMMC 1A, it is possible to suppress or prevent peeling of the wiring substrate 4a and cracking of the cap 7. Besides, this structure for improving the bending strength is a simple structure not requiring the addition of any other new member but requiring only chamfering corners of the wiring substrate 4a of the memory body 4 and corners of the groove 7a of the cap 7, and thus the formation thereof is easy. Thus, a highly reliable FSMMC 1A can be produced without impairing productivity. Also in the FSMMC 1A, like the memory card 1, there exists a long insulating area from the rear side of FSMMC 1A up to the wiring substrate 4a of the memory body 4 and the distance of the electric path from the rear side of FSMMC 1A up to the semiconductor chips in the memory body 4, thus affording a structure in which the semiconductor chips are difficult to be destroyed in the electrostatic breakdown test. Therefore, it becomes possible to improve the yield and reliability of FSMMC 1A. Further, also in FSMMC 1A, like the memory card 1, the area of the wiring substrate 4a of the memory body 4 and the volume of the sealing portion 4m can be made smaller than half of those of the wiring substrate and the sealing member in the structure in which a planar outline of the wiring substrate 4a of the memory body 4 is made almost equal to that of the cap 7, thus permitting FSMMC 1A to be reduced in weight. Particularly, in the FSMMC 1A of this embodiment, since corners of the wiring substrate 4a of the memory body 4 are chamfered, it is possible to attain a further reduction of weight and hence possible to further improve the portability of the FSMMC 1A of this embodiment. As to problems involved in using a memory body 4 about half as large as the cap 7 for FSMMC, as well as the construction for solving the problems which construction involves chamfering corners of the wiring substrate 4a of the memory body 4 and corners of the groove 7a of the cap 7, they are described in PCT/JP01/11640 (International Filing Date: Dec. 28, 2001, Priority Date: Apr. 2, 2001) which includes the inventor in the present case.

Figure 44:
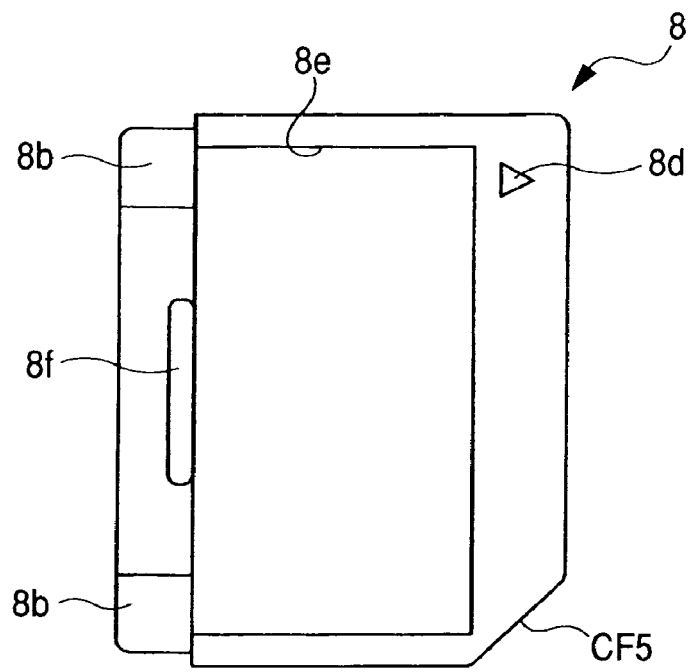
FIG. 44 is a plan view of a surface of a cap which is provided in the assembling process for the IC card of the first embodiment.
Figure 45:
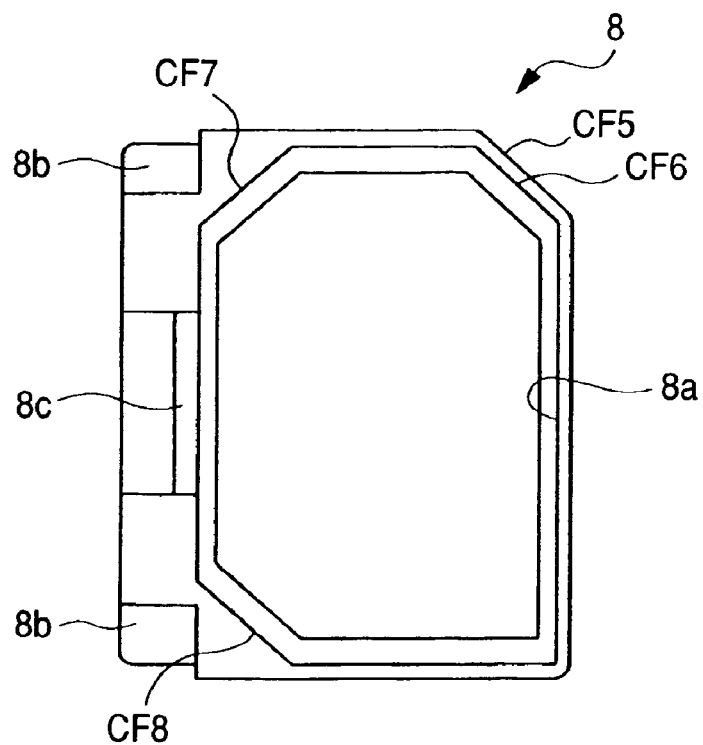
FIG. 45 is a plan view of a back side of the cap shown in FIG. 44.

Turning back to step 202 in FIG. 34, in case of MMC being an RSMMC, there is provided such a cap 8 for RSMMC as shown in FIGS. 44 and 45 (step 400 in FIG. 34). FIGS. 44 and 45 are plan views of a surface and a back side, respectively, of the cap 8. The cap 8 is formed of the same resin as that of the cap 7 and, like the cap 7, one corner on a front side of the cap 8 is chamfered to form a chamfered portion CF5 for index. At the back of the cap 8 there is formed a groove 8a on the side where the chamfered portion CF5 is formed. The groove 8a, in order for the memory body 4 to be fitted therein in a satisfactory manner, is formed in the same planar shape as and in a somewhat larger planar size than the wiring substrate 4a of the memory body 4. Since the groove 8a is the same as the groove 7a of the cap 7, an explanation thereof will here be omitted. At both corners on a rear side of the cap 8 for RSMMC there are formed adapter mounting portions 8d of a projecting section. Recess portions of an adapter for converting the RSMMC into the size of FSMMC are fitted on the adapter mounting portions 8b. At the back of the cap 8, an adapter pawl mounting portion 8c is formed in a longitudinally central position close to the rear side of the cap 8. A pawl of the adapter comes into engagement with the adapter pawl engaging portion 8c. The numeral 8d denotes a mark of a triangular shape in plan, indicating in which direction the RSMMC should be inserted into a desired electronic device, the numeral 8e denotes a depression for sticking thereon of a seal or the like which is for describing various information pieces such as classification of the RSMMC, and numeral 8f denotes a card extracting groove.

Figure 46:
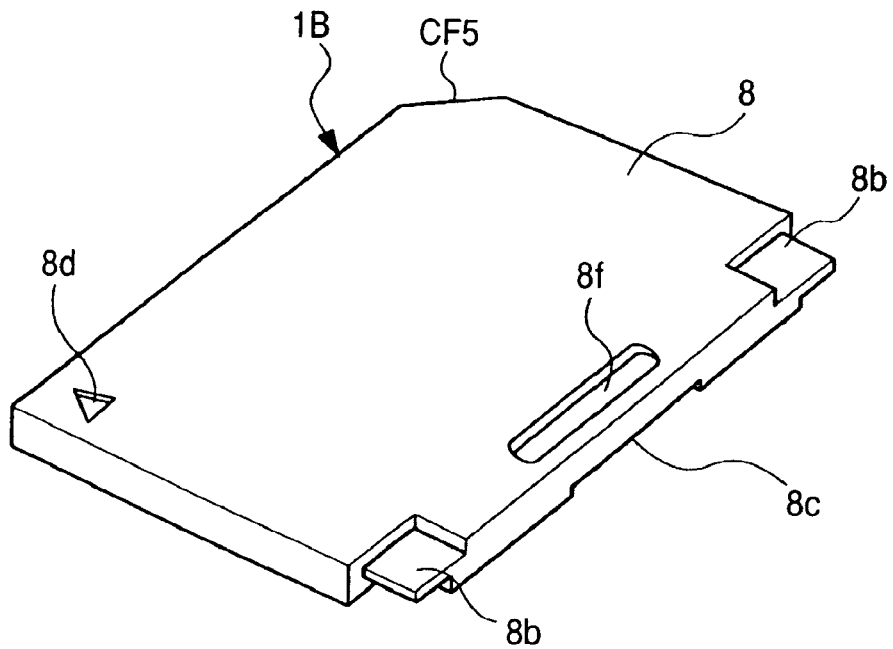
FIG. 46 is an entire perspective view of the surface side of the IC card assembled in accordance with FIGS. 44 and 45.
Figure 47:
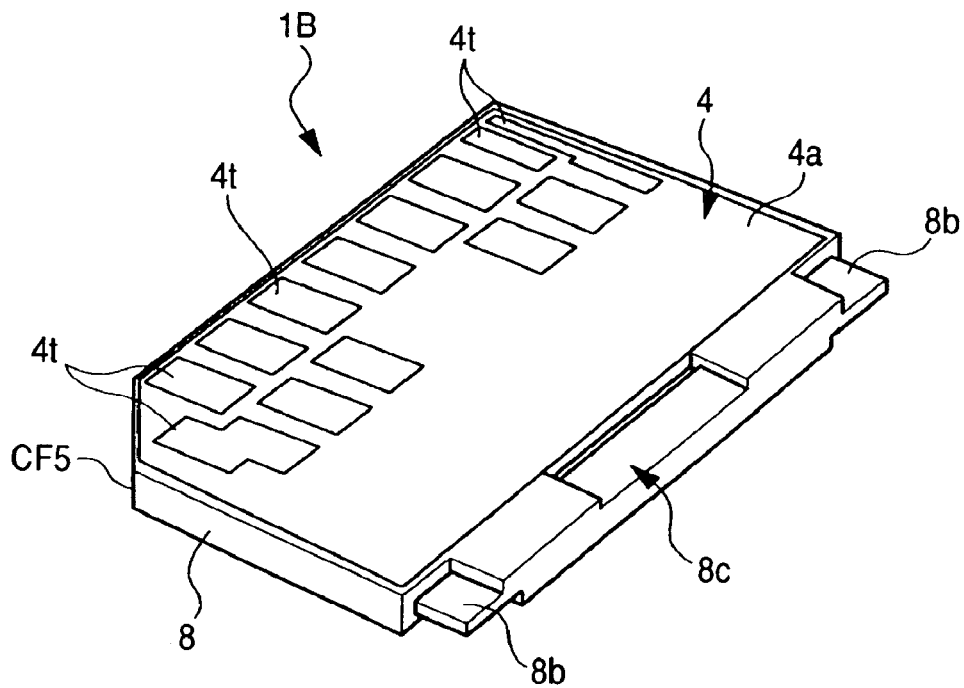
FIG. 47 is an entire perspective view of the back side of the IC card shown in FIG. 46.
Figure 48:
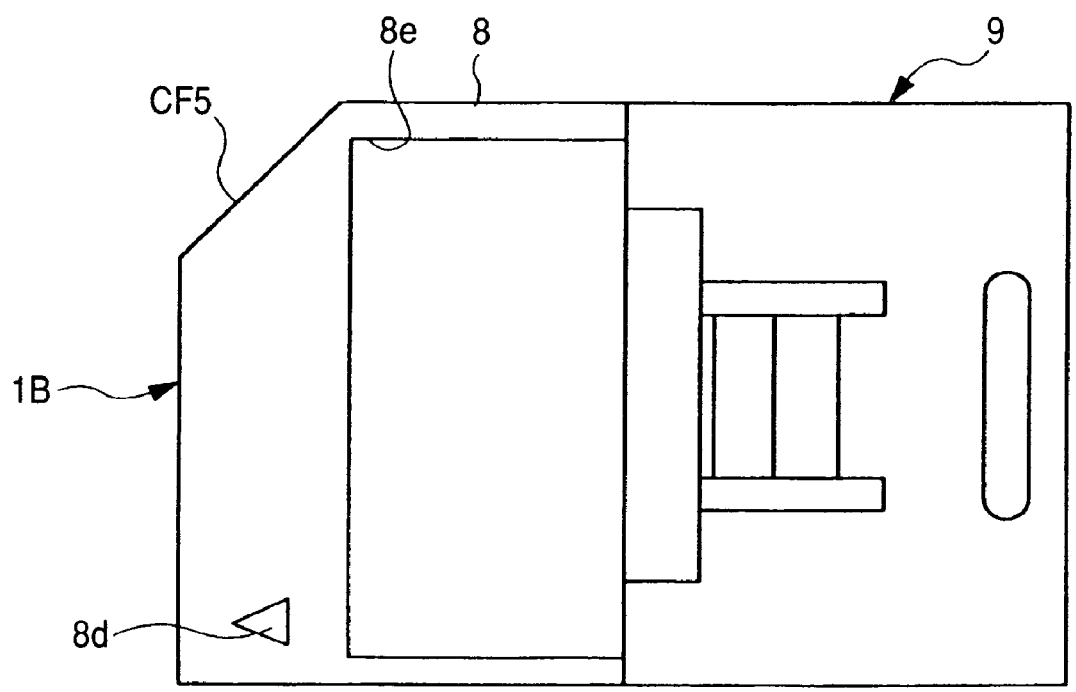
FIG. 48 is a plan view of the surface side of the IC card illustrated in FIGS. 46 with an adapter attached to the IC card.
Figure 49:
FIG. 49 is a side view of the IC card shown in FIG. 48.
Figure 50:
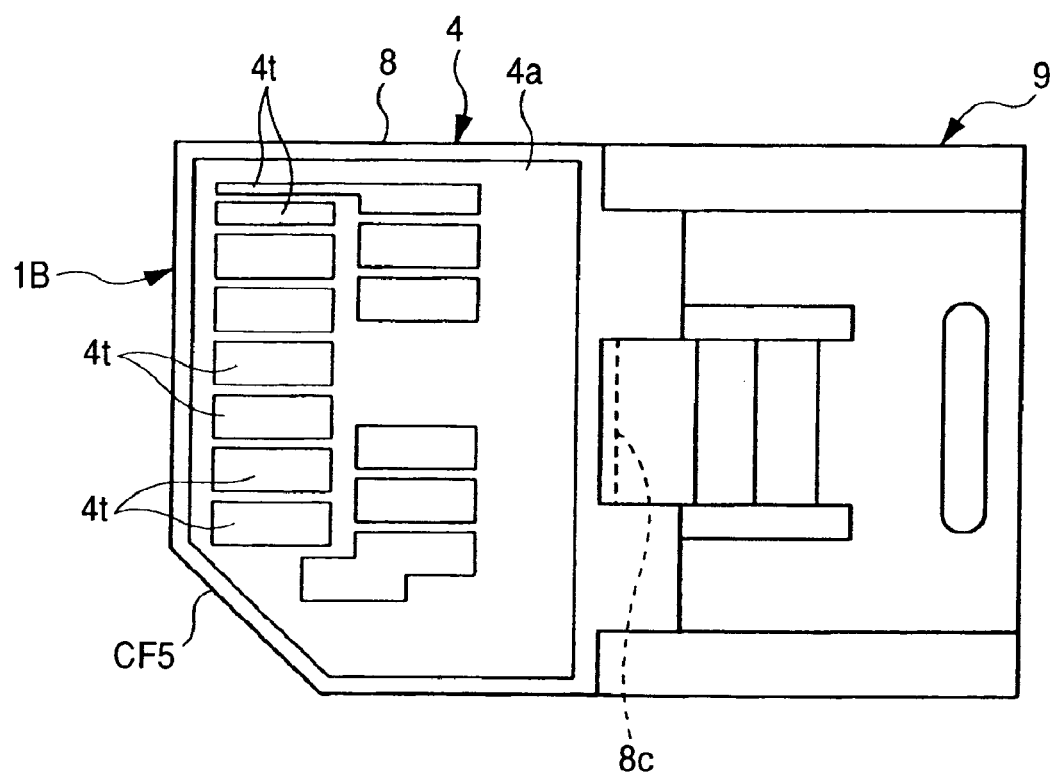
FIG. 50 is a plan view of the back side of the IC card shown in FIG. 48.

Subsequently, in an assembling process for the RSMMC, as shown in FIGS. 46 and 47, the memory body 4 is installed into the groove 8a of the cap 8 and is fixed with an adhesive to assemble RSMMC 1B (step 401 in FIG. 34). FIG. 46 is an entire perspective view of a surface side of RSMMC 1B and FIG. 47 is an entire perspective view of a back side of RSMMC 1B. External dimensions of RSMMC 1B are, for example, 24 mm in long side, 18 mm in short side, and 1.4 mm in width. Also here there is illustrated an example of using the 13-terminal type memory body 4 shown in FIG. 10. FIG. 48 is a plan view of the surface side of RSMMC 1B with an adapter 9 attached thereto, FIG. 49 is a side view thereof, and FIG. 50 is a plan view of the back side thereof. With the adapter 9 attached to the RSMMC 1B, it is possible to effect conversion from RSMMC to FSMMC. As to the RSMMC 1B and the adapter 9, a description thereof is found in the foregoing PCT/JP01/11640 (International Filing Date: Dec. 28, 2001, Priority Date: Apr. 2, 2001) which includes the inventors in the present case.

Thus, in this embodiment, both FSMMC 1A and RSMMC 1B can be produced using the same memory body 4. That is, the assembling step for the memory body 4 can be shared by both FSMMC 1A and RSMMC 1B, whereby the productivity of both cards 1A and 1B can be improved. Although in the above description there was used the memory body 4 of thirteen terminals, there also may be used a nine-terminal memory body 4.

Turning back to step 201 in FIG. 34, a description will now be given about the case where the required memory card is a card conforming to the SD card standard like the memory card 1 of this embodiment. The SD card is compatible with MMC in both external form, or outline, and function. Before explaining the assembling process for the memory card 1 of this embodiment, reference will be made to preparatory steps 500 and 600 for the memory card. First, in preparatory step 500, there is provided the first case 2a (step 501 in FIG. 34). Next, the switch 3 is attached to the switch mounting area SWA of the first case 2a (step 502 in FIG. 34). Thus, in step 502 and subsequent steps in this embodiment, the switch 3, which is a small switch, can be handled integrally with the second case 2a which is relatively large, so that the memory card assembling process can be allowed to proceed smoothly and hence it becomes possible to improve the productivity of the memory card 1. In this embodiment, after assembling plural first cases 2a which each hold the switch 3, the first cases 2a with the switches 3 attached thereto may be placed into a carrier vessel or the like and be stocked. But reference will here be made to the case where the plural first cases 2a which hold the switches 3 are conveyed to a subsequent preparatory step 600 and the step 600 is carried out.

Figure 51:
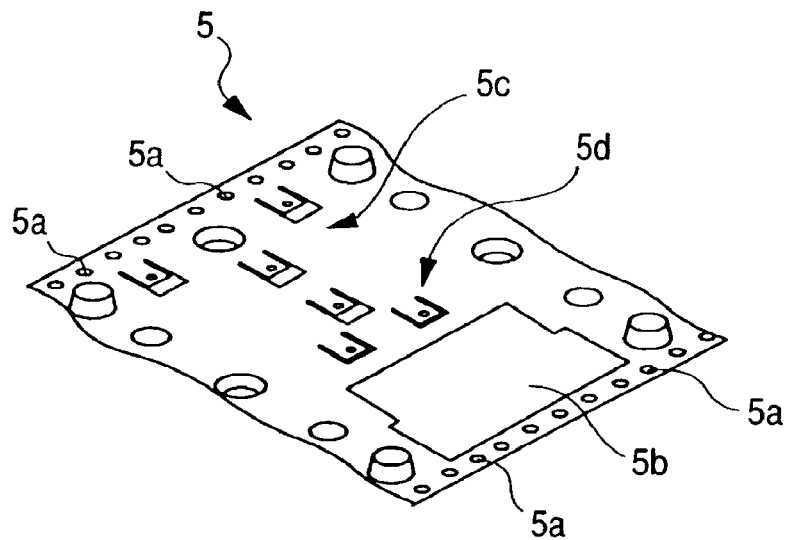
FIG. 51 is a perspective view of a principal portion of the carrier in a preparatory step during fabrication of the IC card of the first embodiment.
Figure 52:
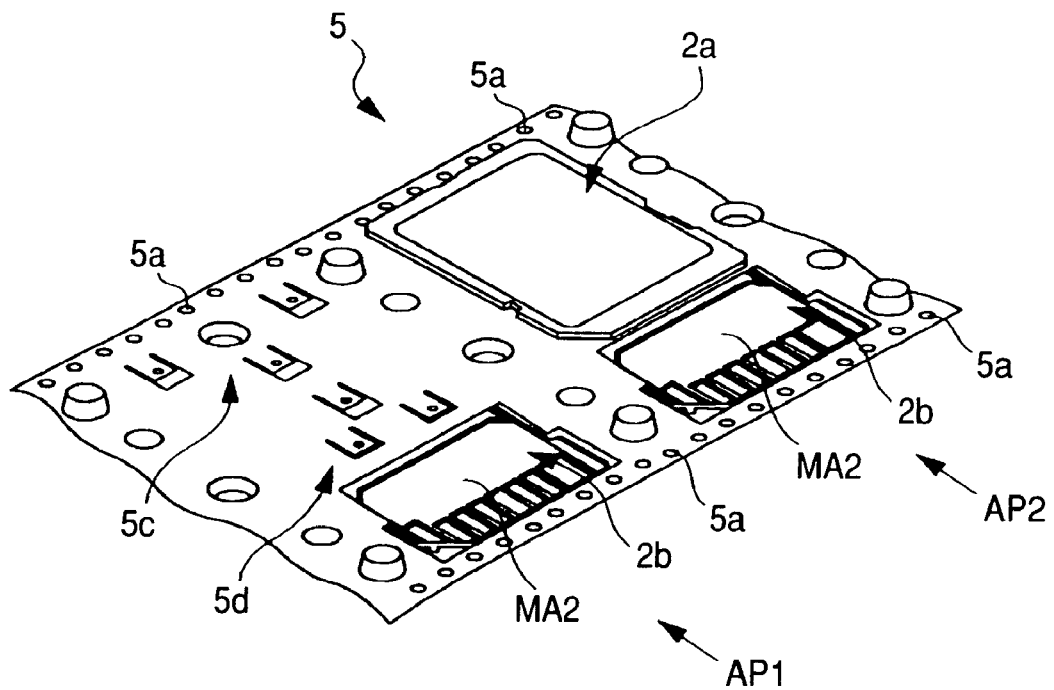
FIG. 52 is a perspective view of a principal portion of the carrier in the preparatory step which follows FIG. 51.

In the subsequent preparatory step 600, first there is provided the carrier tape 5 (step 601 in FIG. 34). FIG. 51 is a perspective view of a principal portion of the carrier tape 5. In this stage, the first and second cases 2a, 2b are not mounted to the carrier tape. Then, as shown in an assembling process AP1 of FIG. 52, the second case 2b is attached to the lower surface (the second surface) of the carrier tape 5 in a state in which the inner surface of the second case 2b faces the lower surface of the tape (step 602 in FIG. 34). That is, the projecting portions 2b2 of the second case 2b are press-fitted into the holes 5d3 formed in the case mounting portions 5d of the carrier tape 5.

Here there is illustrated an example of mounting the second case 2b having eight apertures B shown in FIG. 21, but the second case 2b to be mounted may have twelve apertures B as shown in FIG. 23. Subsequently, as shown in an assembling process AP2 of FIG. 52, the first case 2a which holds the switch 3 is attached to the upper surface (the surface opposite to opposite to the lower surface with the second case 2b attached thereto: the first surface) of the carrier tape 5 (preparatory step 500) in such a manner that the inner surface thereof faces the upper surface of the carrier tape (step 703 in FIG. 34). That is, the projecting portions 2a1 of the first case 2a are press-fitted into the holes 5c3 formed in the case mounting portions 5c of the carrier tape 5. The first and second tapes 2a, 2b are offset in the transverse direction of the carrier tape 5 and the first area MA2 on the inner surface of the second case 2b is exposed from the associated aperture 5 formed in the carrier tape. Such a layout permits the memory card 1 to be assembled automatically on an assembly line as will be described later. Mounting of the first and second cases 2a, 2b is carried out automatically while advancing the carrier tape 5 for each unit area. The order of mounting of the first and second cases 2a, 2b may be reversed. After the first and second cases 2a, 2b have been attached to all the unit areas of the carrier tape 5, the carrier tape is wound up onto a carrier reel. Thus, in this embodiment, the first and second cases 2a, 2b and the switch 3, which constitute the memory card 1, are put together on the carrier tape 5 in such a state as permits the subsequent assembling process to be effected easily, and are in this state provided to the subsequent assembling process. Thus, in comparison with the case where the components of the memory card 1 are carried in a discrete state into the assembling process, the memory card 1 can be assembled in a relatively simple operation without requiring much time and labor. Consequently, it becomes possible to improve the productivity of the memory card 1 and shorten the memory card manufacturing time. In this embodiment, the reel with the carrier tape 5 wound thereon may be stocked. But a description will here be given about the case where the tape-loaded reel is conveyed to the memory card assembling process and the same process is carried out.

Figure 53:
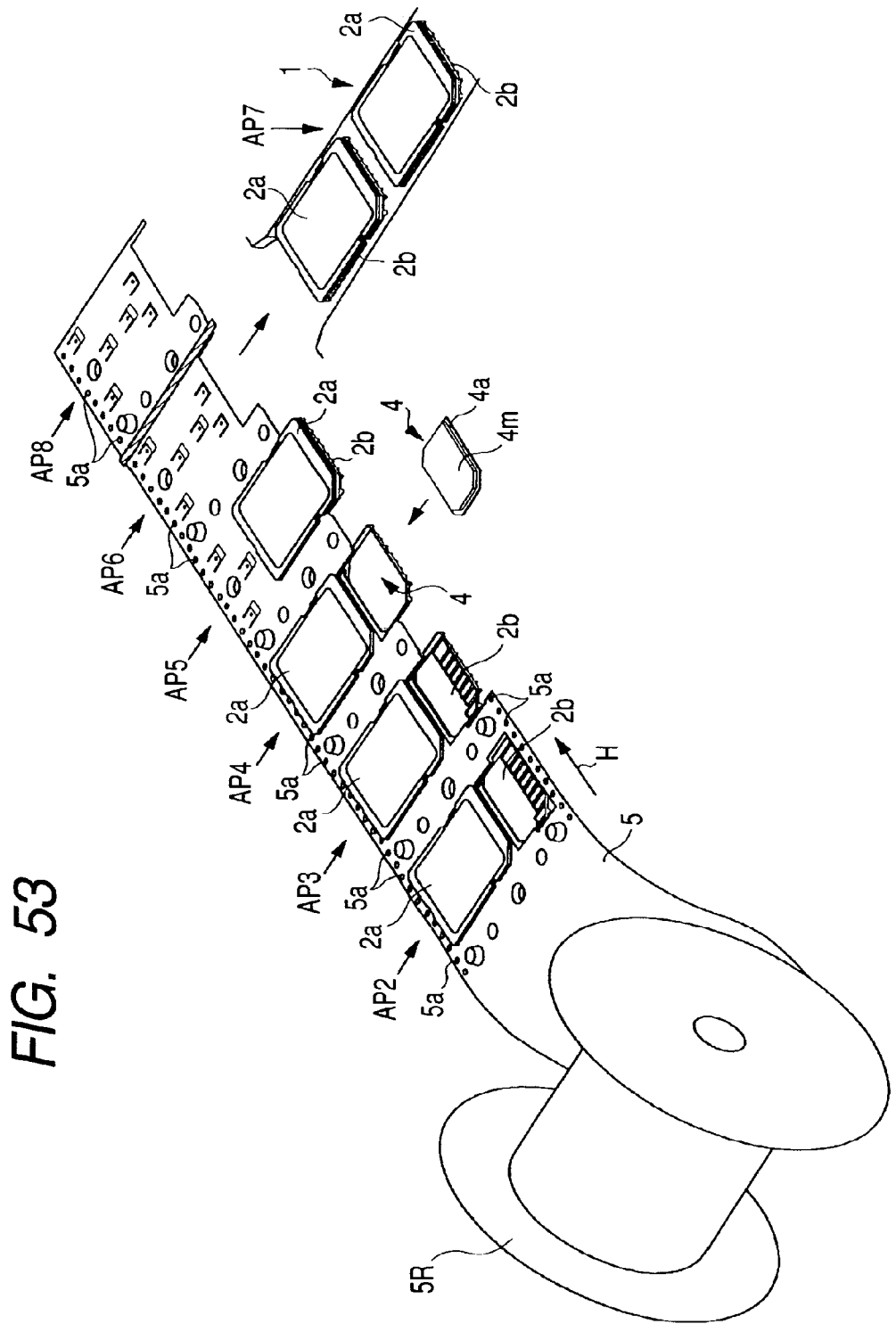
FIG. 53 is a perspective view of a principal portion of the carrier during fabrication of the IC card of the first embodiment.
Figure 54:
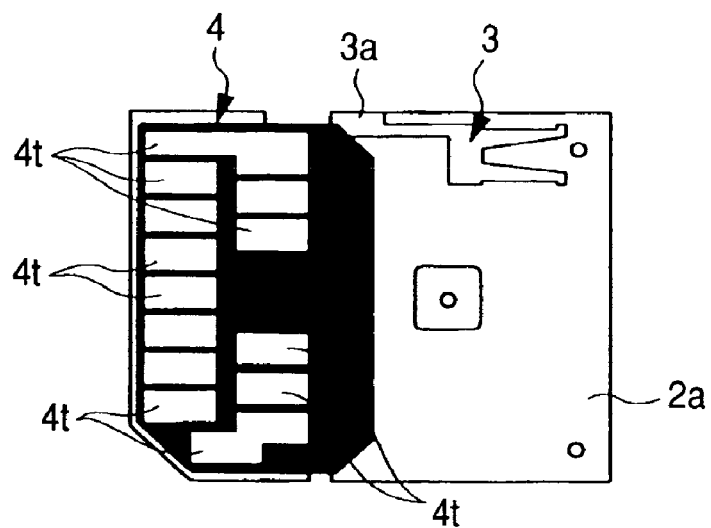
FIG. 54 is a plan view during fabrication of the IC card of the first embodiment.
Figure 55:
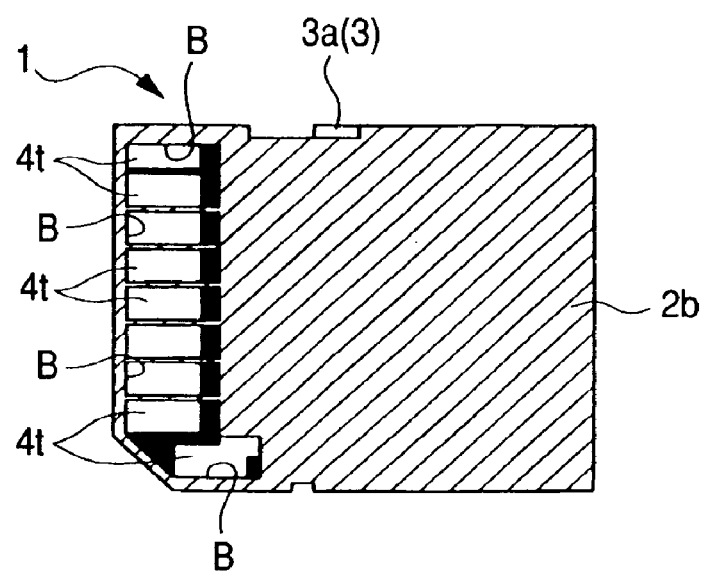
FIG. 55 is a plan view showing an example after fabrication of the IC card of the first embodiment.

The following description is now provided about an assembling process for the memory card 1 conforming to the SD card standard. If an SD card (memory card 1) is selected in step 201 in FIG. 34, it is determined whether the selected memory card is a 9-terminal type or a 13-terminal type (step 203 in FIG. 34). If the answer is a 9-terminal type SD card, the 9-terminal type memory body 4 shown in FIG. 11 may be used from the beginning. But in this embodiment a description will be given of the case where the 13-terminal type memory body 4 shown in FIG. 10 is used. First, in the SD card assembling process, there is provided a carrier tape with case (step 700 in FIG. 34). More specifically, the carrier tape 5 provided in the foregoing preparatory steps 500 and 600 is used. Here there is used the carrier tape 5 to which the second case 2b having eight apertures B is attached. Next, the reel having the carrier tape 5 is loaded into an assembling apparatus to assemble the memory card 1 automatically (step 701 in FIG. 34). FIG. 53 illustrates this assembling process schematically. The numeral 5R denotes the reel and the arrow H denotes a process sequence. The assembling process is carried out automatically on an assembling line while the carrier tape 5 is fed in a successive manner in the direction of arrow H. The assembling process AP2 shows a state in which the first, second cases 2a, 2b and the switch 3 are mounted to the carrier tape 5. As the second case 2b there is used one having eight apertures B. An assembling process AP3 which follows shows cutting part of the carrier tape 5 on the apertures 5b side. In an assembling process AP4 which follows, the memory body 4 is accommodated in the first area MA2 of the second case 2b on the carrier tape 5 in a state in which the back side (the side where the external connecting terminals 4t are formed) of the memory body faces the inner surface of the second case. As the memory body there is used one having thirteen external connecting terminals 4t as described above. In an assembling process AP5 which follows, the first case 2a is pushed out so as to be horizontal with respect to the plane thereof and is superimposed on the second case 2b so as to cover the memory body 4. Relative planar positions of the first and second cases 2a, 2b in this stage are ensured on the assembling apparatus side. In an assembling process AP6 which follows, both first and second cases 2a, 2b are pushed out simultaneously from the carrier tape 5. At this time, the projecting portions 2a1 of the first case 2a are fitted in the recess portions 2b1 of the second case 2b, whereby the relative planar positions of the first and second cases 2a, 2b are registered with each other in a self-alignment manner. In an assembling step AP7 which follows, the projecting portions 2a1 of the first case 2a are press-fitted into the recess portions 2b1 of the second case 2b and thereafter the contact portion between the first and second cases 2a, 2b is melted to a slight extent by ultrasonic oscillation to bond both cases 2a and 2b with each other. Further, in an assembling process AP8 shown in FIG. 53, the unit area on the carrier tape 5 which has become unnecessary is cut off. In this way the memory card 1 is assembled. In the above example, as shown in FIG. 54, there is used the memory body 4 having thirteen external connecting terminals 4t, but since there is used the second case 2b having eight apertures B, as shown in FIG. 55, it is possible to automatically assemble the memory card 1 having nine external connecting terminals 4t. Thus, in this embodiment, the number of external connecting terminals 4t of the memory card 1 can be changed by selecting a suitable type of the second case 2b. Therefore, it is possible to cope with a change of the type in the memory card assembling process versatilely and that quickly. Although the memory body used above is a 13-terminal type, there may be used a 9-terminal type memory body 4 from the beginning.

Turning back to step 203 in FIG. 34, a description will be given of the case where a 13-terminal type SD card is selected. Also in this case there are performed operations which are almost the same as above (step 800 in FIG. 34). That is, the carrier tape 5 provided in the preparatory steps 500 and 600 is used. In this case, however, such a second case 2b having twelve apertures B as shown in FIG. 23 is attached to the carrier tape 5. Subsequently, in the same manner as above, the reel having the carrier tape 5 is loaded into the assembling apparatus to assemble the memory card 1 automatically (step 801 in FIG. 34). Also in this case, in the assembling process AP4 shown in FIG. 53, the memory body 4 having thirteen external connecting terminals 4t is accommodated on the carrier tape in the same manner as above. In this way, as shown for example in FIG. 56, it is possible to assemble a memory card 1 having thirteen external connecting terminals 4t.

Thus, in this embodiment, using the same memory body 4, it is possible to fabricate different kinds of memory cards which are MMCs (FSMMC 1A and RSMMC 1B) and SD cards (9-and 13-terminal type memory cards 1) That is, the assembling process for the memory body 4 can be shared by such different types of memory cards as MMCs (FSMMC 1A and RSMMC 1B) and SD cards (9-and 13-terminal types), so that it becomes possible to improve the productivity of both different types of memory cards as MMCs (FSMMC 1A and RSMMC 1B) and SD cards (9-and 13-terminal types). It is also possible to shorten the manufacturing time of both such different types of memory cards.

In this embodiment, the memory body 4, the first case 2a which holds the switch 3, and the carrier tape 5 having the first and second cases 2a, 2b, can be used in various types of memory cards and therefore can each be stocked. Consequently, the actual memory card assembling process can be started from step 201 in FIG. 34, so that it is possible to shorten the manufacturing time of both different types of memory cards of MMCs (FSMMC 1A and RSMMC 1B) and SD cards (9-and 13-terminal types).

Second Embodiment

In the previous first embodiment there has been described a method wherein a change is made from 13-to 9-terminal type in the case where a planar outline of the memory body is smaller than half of a planar outline of each of the first and second cases. This technique is also applicable to memory cards conforming to the SD card standard in the case where a planar outline of the memory body is almost the same as that of each of the first and second cases.

Figure 57:
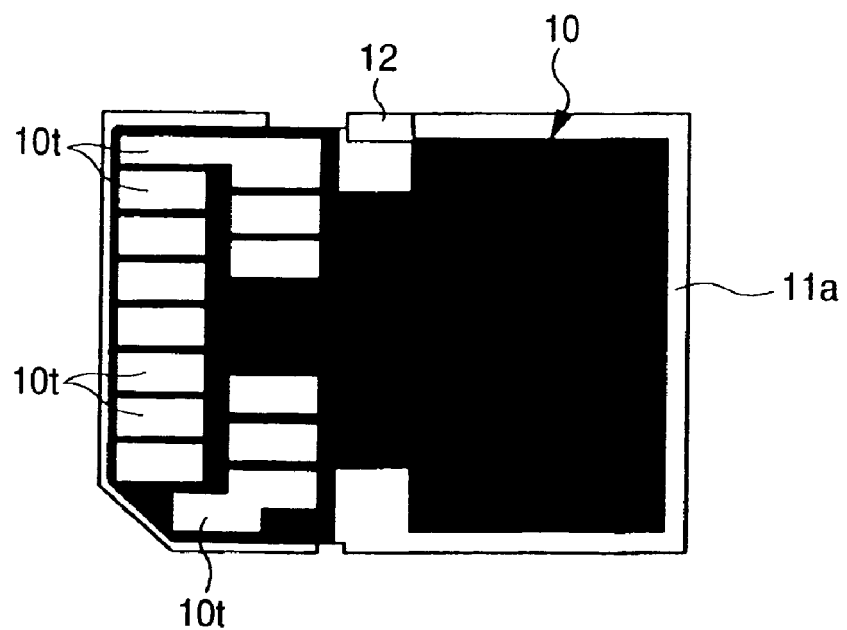
FIG. 57 is a plan view of a back side of an IC body of an IC card according to a second embodiment of the present invention.
Figure 58:
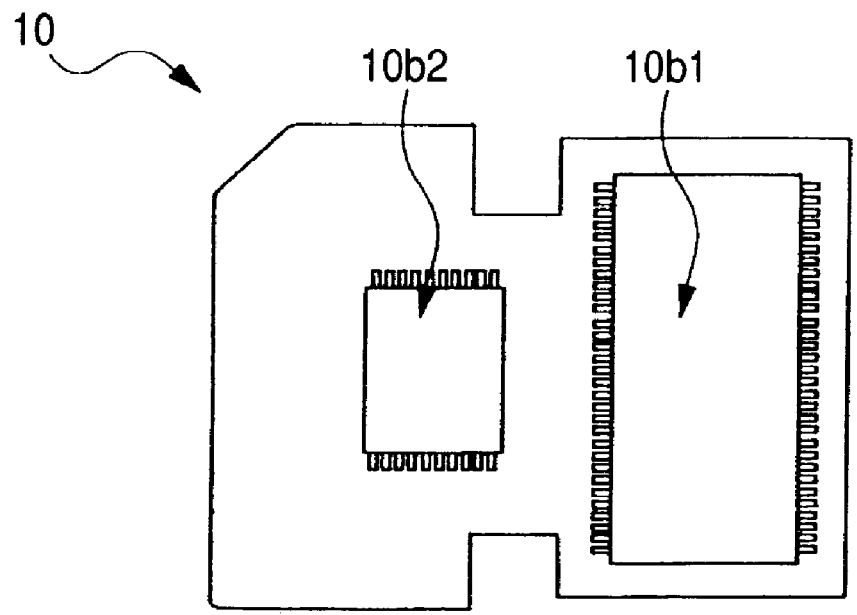
FIG. 58 is a plan view of a main surface of the IC body shown in FIG. 57.
Figure 59:
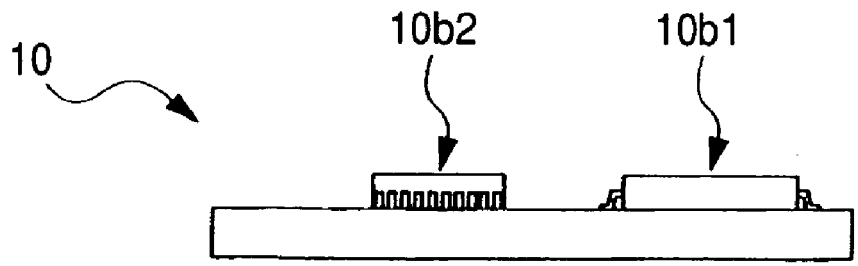
FIG. 59 is a side view of the IC body shown in FIG. 58.

FIGS. 57 to 59 illustrate a part of a memory card conforming to the SD card standard in case of a memory body 10 being almost equal in planar outline to the first case 11a, of which FIG. 57 is a plan view of a back side of the memory body 10, FIG. 58 is a plan view of a main surface of the memory body 10, and FIG. 59 is a side view of the memory body 10. For example, thirteen external connecting terminals 10t are arranged on a back side of a wiring substrate 10a of the memory body 10. Flat packages 10b1 and 10b2 are mounted on the main surface of the memory body 10. A chip having the foregoing memory circuit is sealed in the flat package 10b1 and a chip having a control circuit for the memory chip is sealed in the flat package 10b2. The numeral 12 denotes a switch.

Figure 56:
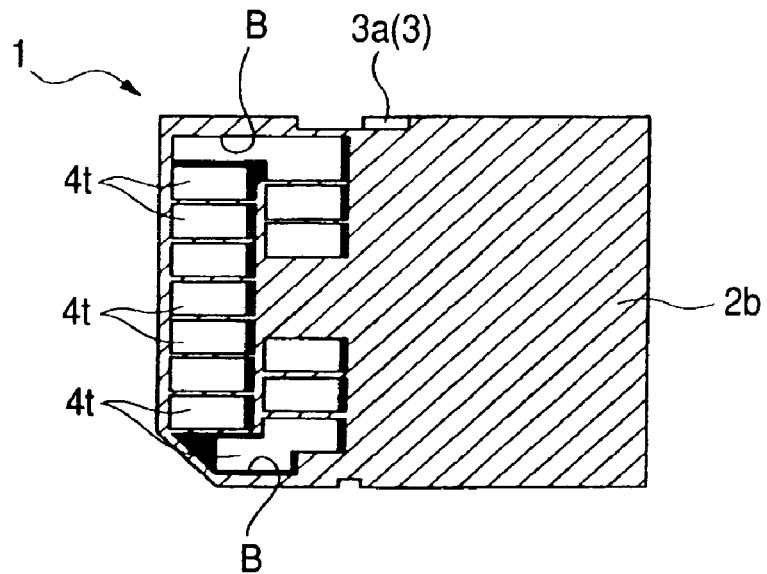
FIG. 56 is a plan view showing an example after fabrication of the IC card of the first embodiment.

Also in this case, if there is selected the second case having eight apertures B as shown in FIG. 21, it is possible to assemble a 9-terminal memory card as shown in FIG. 55, while if there is selected the second case having twelve apertures B as shown in FIG. 23, it is possible to assemble a 13-terminal memory card as shown in FIG. 56.

Third Embodiment

Figure 60A:
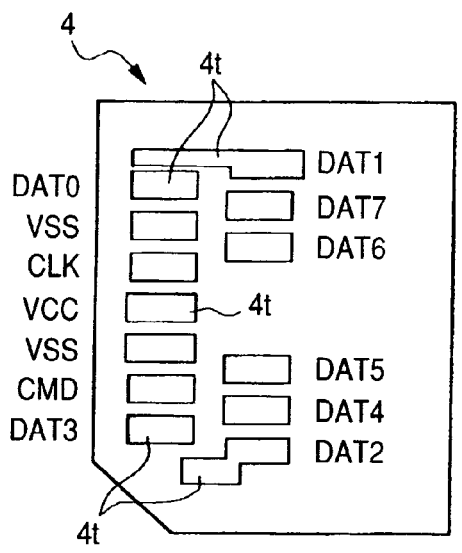
FIGS. 60(a) to (c) are plan views of the IC body, showing pin array examples of external connecting terminals of the IC body in various operation modes of the IC card of the first embodiment.
Figure 60B:
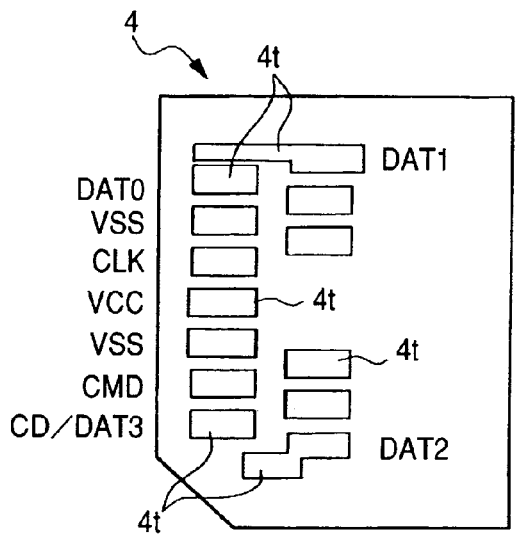
Figure 60C:
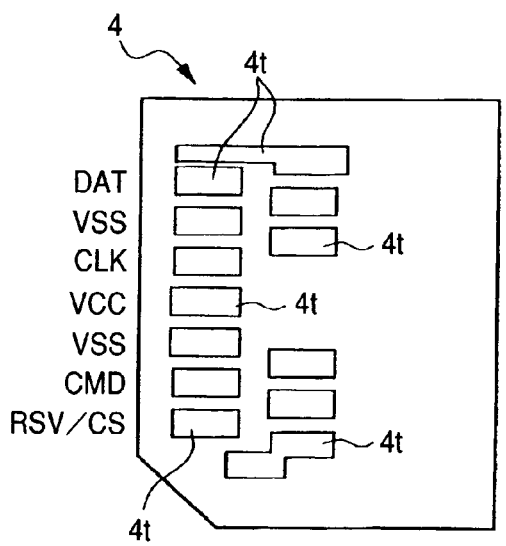

FIGS. 60(a) to (c) show layout examples of pins used as external connecting terminals 4t of the memory body 4 in various operation modes. In FIG. 60(a), all of thirteen external connecting terminals 4t are used in 8-bit mode. This mode permits data to be processed at the highest speed. In FIG. 60(b), nine, out of thirteen, external connecting terminals 4t are used in 4-bit mode. This mode permits data to be processed at the highest speed after the 8-bit mode speed. In FIG. 60(c), seven, out of thirteen, external connecting terminals 4t are used in 1-bit mode. DAT and DAT0 to DAT7 represent external connecting terminals 4t for data signals, CLK represent an external connecting terminal 4t for clock signal, CMD represents an external connecting terminal 4t for command signal, CD represents an external connecting terminal for card detect signal which, upon loading of the memory card 1 into an electronic device, tells the electronic device that the memory card has been loaded, RSV represents an external connecting terminal 4t for reserve, CS represents an external connecting terminal 4t for chip select signal, VCC represents an external connecting terminal 4t for a high potential-side supply voltage, and VSS represents an external connecting terminal 4t for a reference potential-side supply voltage.

Figure 61:
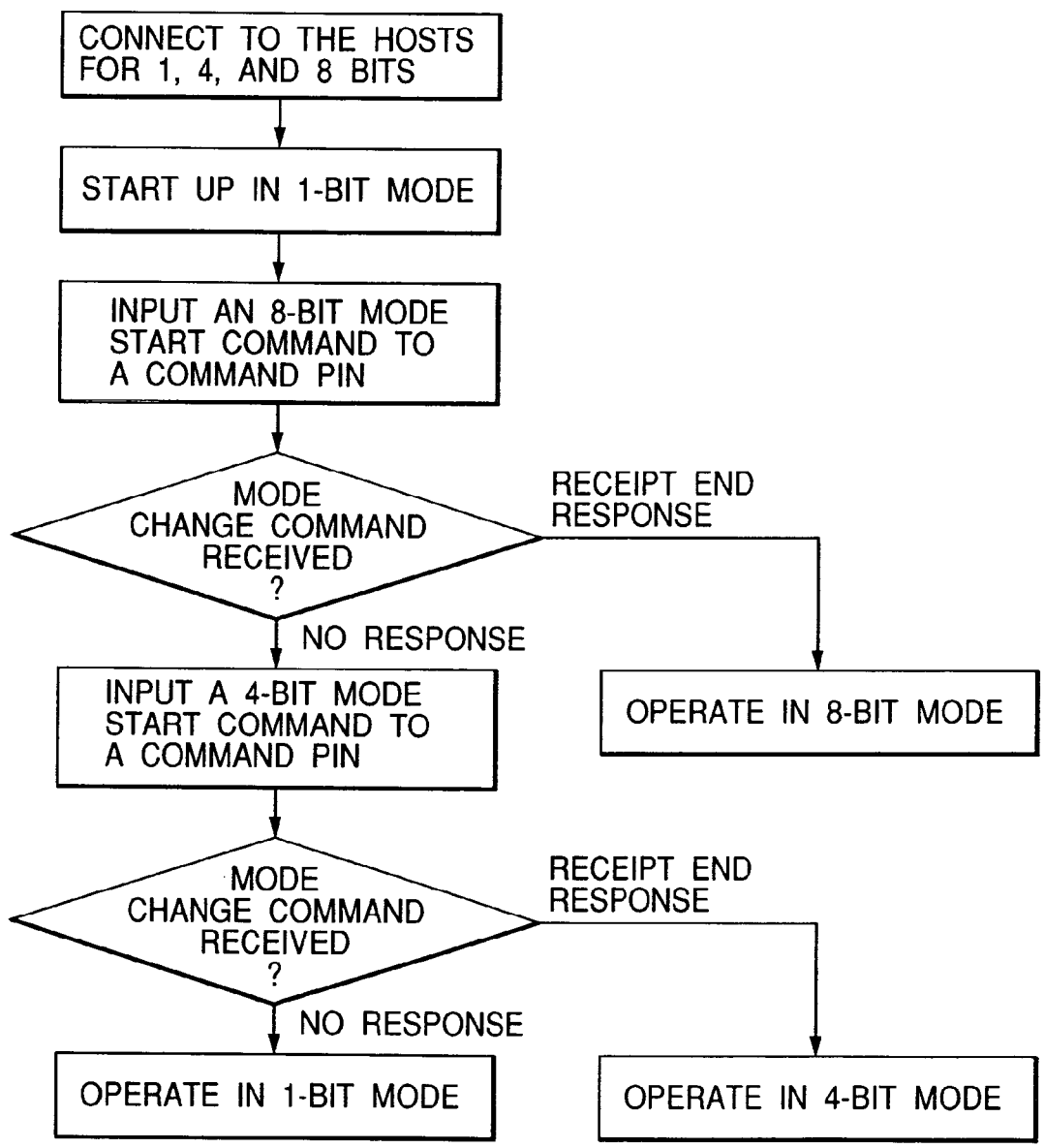
FIG. 61 is a set-up operation flow chart for judging in which operation mode the IC card of the first embodiment is when the IC card is loaded into a desired electronic device.
Figure 62:
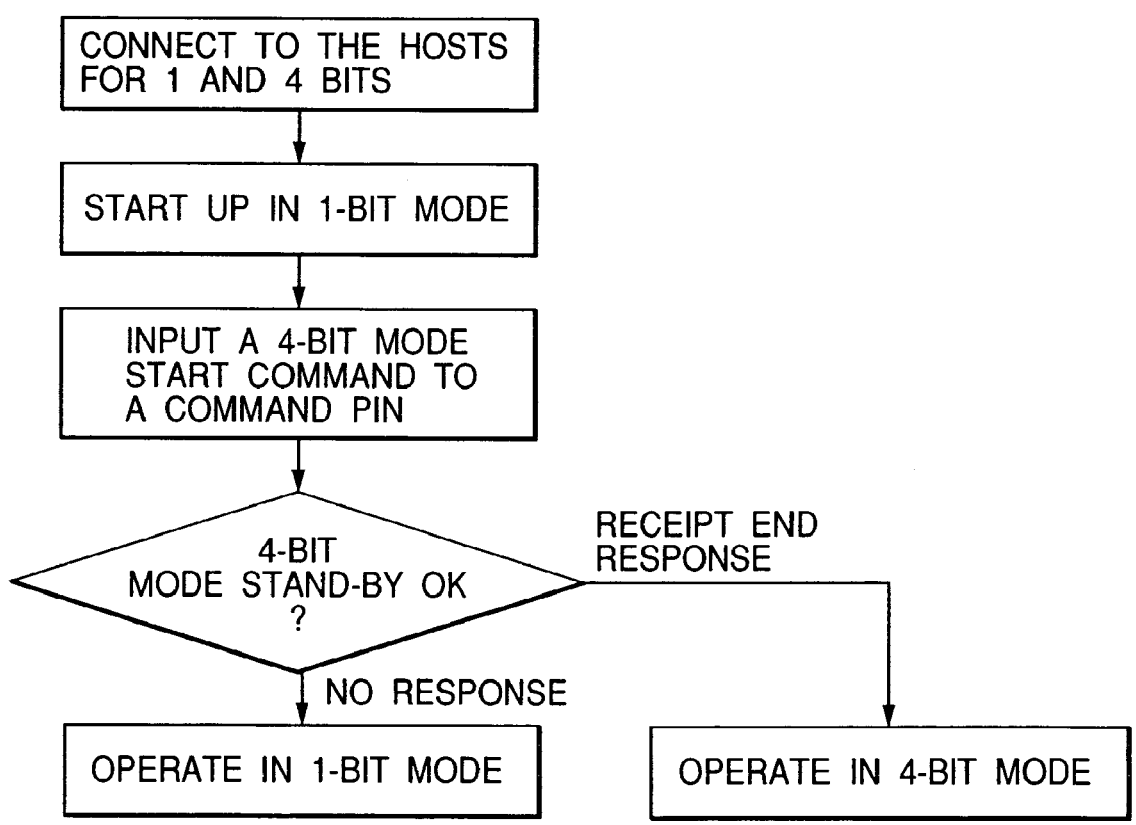
FIG. 62 is also a set-up operation flow chart for judging in which operation mode the IC card of the first embodiment is when the IC card is loaded into a desired electronic device.

FIGS. 61 and 62 are set-up operation flow charts for determining in which of the above operation modes the memory card 1 operates when loaded into an electronic device. FIG. 61 is a flow chart corresponding to the above three modes and FIG. 62 is a flow chart corresponding to both 1-and 4-bit modes. In both FIGS. 61 and 62, when the memory card 1 is loaded into a desired electronic device and its external connecting terminals 4t are connected to hosts (connectors) on the electronic device side, operation 8-and 4-bit mode start commands are inputted successively to the external connecting terminals 4T (CMD) for command in the memory card 1, and when a receipt end response to the mode change commands is given, operation is performed in the mode corresponding to that response. If a response is made to neither the 8-bit nor the 4-bit mode change command, operation is performed in 1-bit mode. On the other hand, in FIG. 62, after operation is started in 1-bit mode, a 4-bit mode start command is inputted to the external connecting terminal 4t (CMD) for command in the memory card 1 and it is determined whether preparation for the 4-bit mode is completed or not. If there is a response thereto, operation is performed in 4-bit mode, while unless there is any response, operation is performed in 1-bit mode.

For making correspondence to the terminals used in the above various modes, the controller chip 4c2, which has thirteen terminals (thirteen external connecting terminals 4t) as described in the first embodiment, on the memory body 4 possesses a function of starting operation in 1-bit mode, a function of starting operation in 8-bit mode in response to the 8-bit mode start command, and a function of starting operation in 4-bit mode in response to the 4-bit mode start command.

As described in the previous first embodiment, if the wiring substrate 4a of the memory body 4 having thirteen terminals is used to form a 9-terminal 4-bit memory card 1 while covering external connecting terminals 4t selectively with the case, and if there is used the controller chip 4c1 corresponding to 1-, 4-and 8-bit modes, it is necessary to give some consideration to the external form of the card so as to prevent an erroneous insertion of the card into the host (connector on the electronic device side) for 8 bits. For example, it is necessary to thicken the 4-bit mode memory card to such an extent as prevents the insertion thereof into the 8-bit host.

Although the present invention has been described above concretely by way of embodiments thereof, it goes without saying that the present invention is not limited to the above embodiments, but that various changes may be made within the scope not departing from the gist of the invention.

For example, as a chip connecting method there may be adopted a connecting method which adopts bump electrodes, in addition to the wiring bonding method.

The relation between the projecting and recess portions used in alignment of the first and second cases and also in conveyance may be reverse. Further, the second case having apertures for exposure of the external connecting terminals may be provided with a switch mounting area.

Although the present invention has been described above mainly about the case where it is applied to a memory card which incorporates a flash memory (EEPROM) as a background application field thereof, no limitation is made thereto. For example, the present invention is also applicable to memory cards incorporating such other memory circuits as SRAM (Static Random Access Memory), FRAM (Ferroelectric Random Access Memory), and MRAM (Magnetic Random Access Memory). The invention is further applicable to an IC (integrated circuit) card not having a memory circuit.

The following is a brief description of effects obtained by typical modes of the invention as disclosed herein.

In an IC card of the type wherein an IC body having a wiring substrate and a semiconductor chip connected thereto electrically is held in a sandwiched fashion by a case, the IC body, whose planar outline is smaller than half of the case, is disposed in an area located closer to a first end side of the case with respect to a midline between the first end side and a second end side of the case opposite to the first end side, whereby it is possible to improve the reliability of the IC card.

Further, in an IC card of the type wherein an IC body having a wiring substrate and a semiconductor chip connected electrically thereto is held in a sandwiched fashion by a case, the IC body, whose planar outline is smaller than half of the case, is disposed in a first area located closer to a first end side of the case with respect to a midline between the first end side and a second end side of the case opposite to the first end side, and a second area which contributes to assembling the IC card is formed in the other area than the first area, whereby it is possible to improve the productivity of IC card.

What is claimed is:

1. A method of manufacturing an IC card, comprising the steps of:
   (a) providing a wiring substrate having an external connecting terminal and wiring;
   (b) disposing a semiconductor chip over the wiring substrate and connecting the semiconductor chip electrically to the external connecting terminal through bonding wire; and
   (c) covering the wiring substrate and the semiconductor chip with a case in such a manner that the external connecting terminal of the wiring substrate is exposed,
   wherein the case has a first end side near which the external connecting terminal is disposed and a second end side positioned on an opposite side to the first end side,
   wherein a planar outline of the wiring substrate is smaller than half of a planar outline of the case,
   wherein the step (c) comprises a step of disposing the wiring substrate in an area of the case closer to the first end side with respect to a middle position between the first and the second end side, and
   wherein the step (c) further comprises the steps of
   (c1) allowing a movable switch to be held in an area of the case other than the area where the wiring substrate is disposed;
   (c2) providing a carrier;
   (c3) mounting the plural cases each holding the movable switch to the carrier; and
   (c4) accommodating the wiring substrate and the semiconductor chip in each of the plural cases on the carrier.

2. A method of manufacturing an IC card, comprising the steps of:
   (a) providing a wiring substrate having an external connecting terminal and wiring;
   (b) disposing a semiconductor chip over the wiring substrate and connecting the semiconductor chip electrically to the external connecting terminal through bonding wire; and
   (c) covering the wiring substrate and the semiconductor chip with a case in such a manner that the external connecting terminal of the wiring substrate is exposed,
   wherein the case has a first end side near which the external connecting terminal is disposed and a second end side positioned on an opposite side to the first end side,
   wherein a planar outline of the wiring substrate is smaller than half of a planar outline of the case,
   wherein the step (c) comprises a step of disposing the wiring substrate in an area of the case closer to the first end side with respect to a middle position between the first and the second end side,
   wherein the case has a first case and a second case,
   wherein the step (c) further comprises the steps of
   (c1) providing a carrier, the carrier having a first surface and a second surface located on an opposite side to the first surface;
   (c2) mounting the plural first cases to the first surface of the carrier;
   (c3) mounting the plural second cases to the second surface of the carrier; and
   (c4) accommodating the wiring substrate and the semiconductor chip so as to be sandwiched in between the first and the second case, and
   wherein, in the step (c4), relative planar positions of the first and the second case are registered with each other in a self-alignment manner by an aligning functional portion disposed in an area other than the area where the wiring substrate is disposed in the first and the second case.

3. A method according to claim 2,
   wherein the first and the second case are provided, in an area other than the area where the wiring substrate is disposed, with mounting means for mounting the first and the second case to the carrier.

4. A method according to claim 2,
   wherein the step (c) further comprises a step of allowing a movable switch to be held in an area other than the area where the wiring substrate is disposed in the first or the second case before mounted to the carrier.

* * * * *